United States Patent
Shih et al.

(10) Patent No.: US 10,876,976 B2
(45) Date of Patent: Dec. 29, 2020

(54) APPARATUS AND METHOD FOR SUBSTRATE INSPECTION

(71) Applicant: TAIWAN SEMICONDUCTOR MANUFACTURING COMPANY LTD., Hsinchu (TW)

(72) Inventors: Bo-Han Shih, Taipei (TW); Sheng-Hsiang Chuang, Hsinchu (TW); Hsu-Shui Liu, Taoyuan County (TW); Jiun-Rong Pai, Hsinchu County (TW); Shou-Wen Kuo, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/117,666

(22) Filed: Aug. 30, 2018

(65) Prior Publication Data
US 2020/0072760 A1 Mar. 5, 2020

(51) Int. Cl.
*G01N 21/95* (2006.01)
*H01L 21/67* (2006.01)
*H01L 21/68* (2006.01)
*H01L 21/687* (2006.01)

(52) U.S. Cl.
CPC ..... *G01N 21/9503* (2013.01); *G01N 21/9505* (2013.01); *H01L 21/67288* (2013.01); *H01L 21/681* (2013.01); *H01L 21/68742* (2013.01); *H01L 21/68764* (2013.01)

(58) Field of Classification Search
CPC ............ G01N 21/9503; G01N 21/9505; H01L 21/67288; H01L 21/681; H01L 21/68742; H01L 21/68764
USPC ....................... 356/237.1–237.6, 239.1–239.8
See application file for complete search history.

(56) References Cited

U.S. PATENT DOCUMENTS

| | | | |
|---|---|---|---|
| 6,271,916 B1* | 8/2001 | Marxer | G01N 21/9501 356/237.3 |
| 6,298,280 B1* | 10/2001 | Bonora | H01L 21/681 414/941 |
| 2003/0030795 A1* | 2/2003 | Swan | G01N 21/9503 356/237.4 |
| 2010/0133257 A1* | 6/2010 | Sorabji | H01L 21/67115 219/447.1 |
| 2012/0013897 A1* | 1/2012 | Lai | H01L 31/188 356/237.1 |
| 2013/0010289 A1* | 1/2013 | Nakamizo | H01L 21/67259 356/237.2 |
| 2016/0078626 A1* | 3/2016 | Kodama | H01L 21/681 382/149 |

* cited by examiner

*Primary Examiner* — Tri T Ton
(74) *Attorney, Agent, or Firm* — WPAT, P.C., Intellectual Property Attorneys; Anthony King

(57) ABSTRACT

The present disclosure provides an apparatus for substrate inspection, including a chamber, a movable holder in the chamber and configured to hold a substrate and transfer the substrate between a first position and a second position, a first inspector under the first position and the second position in the chamber, and configured to inspect a backside of the substrate, a lifter under the second position in the chamber, and configured to support the substrate and move the substrate from the second position to a third position, and a second inspector near the third position in the chamber and configured to inspect an edge of the substrate at the third position.

20 Claims, 27 Drawing Sheets

APPARATUS AND METHOD FOR SUBSTRATE INSPECTION

BACKGROUND

Various operations are involved during the fabrication of semiconductor structure, for example, lithography, etching, deposition, cleaning, removal, and the like. During the fabrication operations, defects such as particles, residual films, slurry, peeling, cracks, containments, non-uniform surface, or damages may be induced, further causing yield loss.

In order to improve the yield rate of the fabrication operations, an apparatus for inspecting substrate may be utilized to inspect the defects such as particles, containments, residual films, slurry, peeling, cracks, non-uniform surface, or damages induced during the fabrication operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
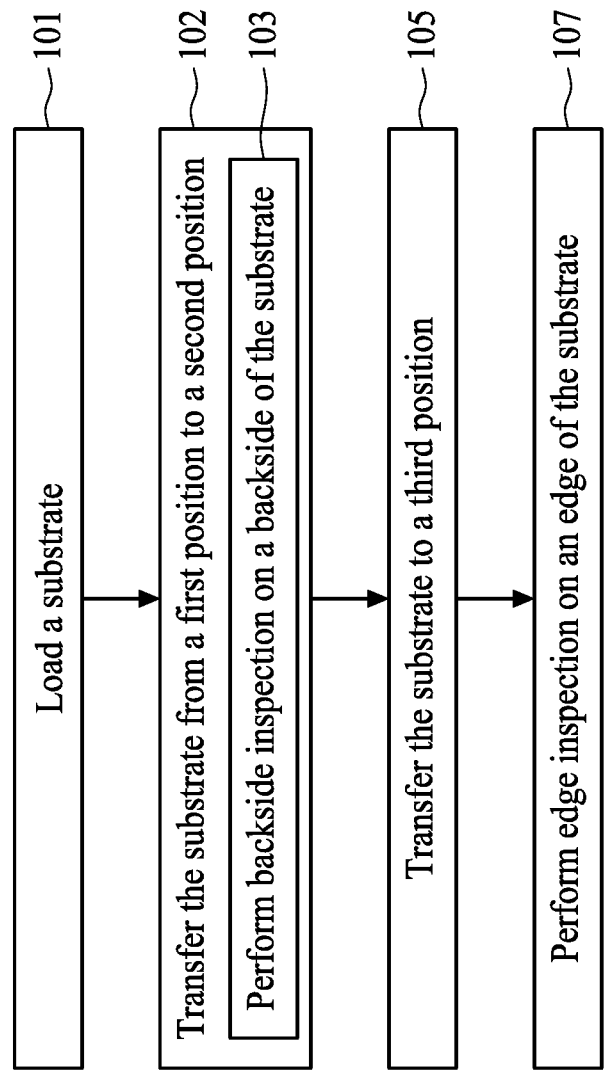
FIG. 1A shows a flow chart representing method for substrate inspection, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Automated optical inspection (AOI) is one of the skills to inspect the edge area, frontside surface, and/or backside surface of a substrate, such as a wafer, a panel, or the like. When performing inspection on backside surface or frontside surface of the substrate, edge-handling clips or fixtures may be used to secure the substrate. However, when performing edge inspection on the edge area, edge-handling clips or fixtures may interfere edge inspection operation, thence edge inspection operation may be performed in a module separated from a module for performing backside inspection and/or frontside inspection in order to avoid such interference, whereas the duration of transferring substrates between modules may be significantly increased. Therefore, the cost of inspection operations may be driven up as the inspection efficiency may be lowered.

In order to enhance the efficiency of inspection process, some embodiments of the present disclosure provides an apparatus along with methods to incorporate the edge area inspection with backside surface inspection and/or the frontside surface inspection in one chamber, or in one module. The amount of time of transferring the substrate between the stages of edge area inspection, frontside surface inspection, and/or backside surface inspection may thus be reduced, improving the efficiency of the inspection operation.

Referring to FIG. 1A, FIG. 1A is a flow chart representing method for substrate inspection, in accordance with some embodiments of the present disclosure. The method for substrate inspection may include loading a substrate, transferring the substrate from a first position to a second position, performing backside inspection on a backside of the substrate, transferring the substrate to a third position, and performing edge inspection on an edge of the substrate.

Figure 1B:
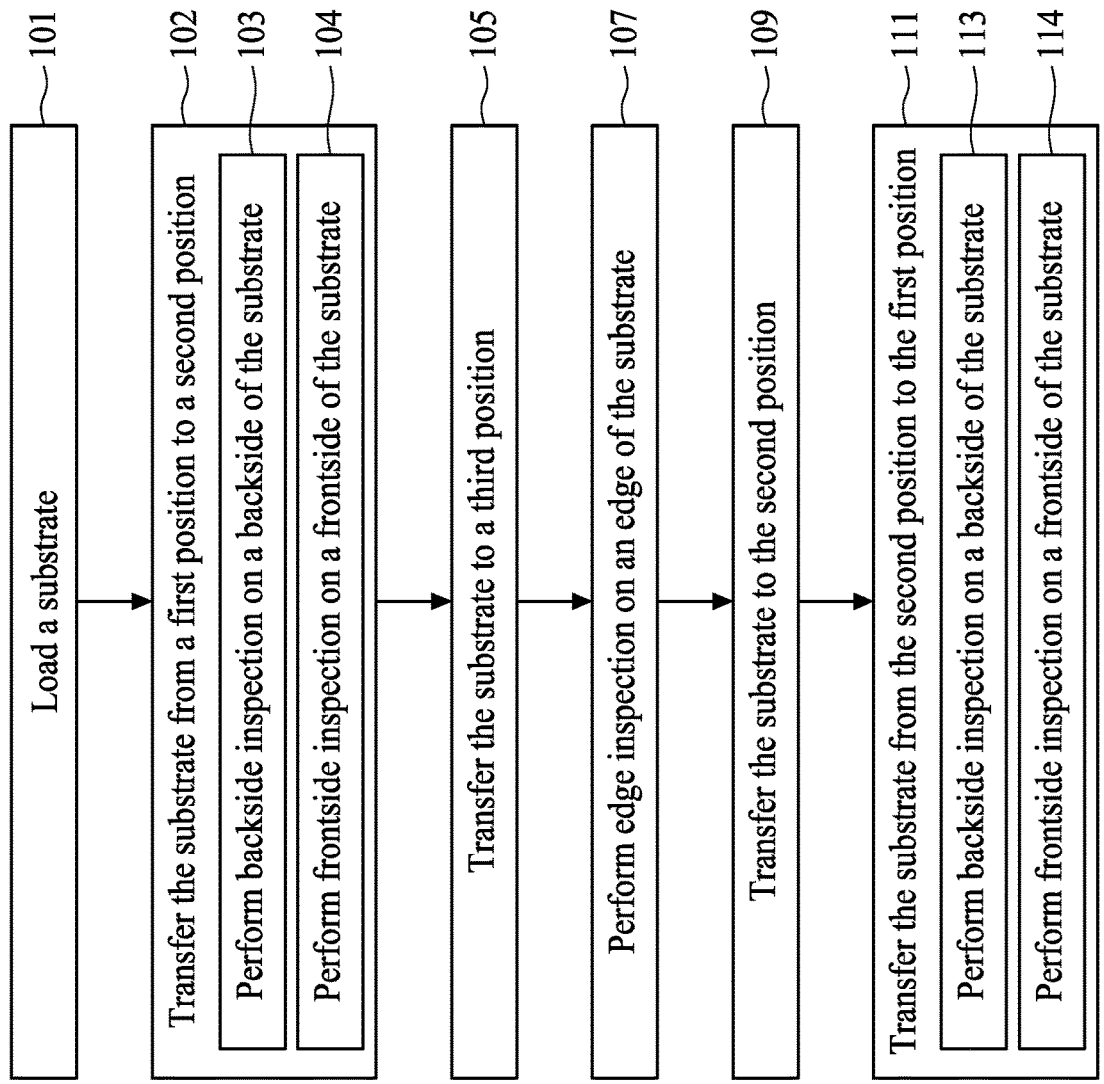
FIG. 1B shows a flow chart representing method for substrate inspection, in accordance with some embodiments of the present disclosure.

Referring to FIG. 1B, FIG. 1B is a flow chart representing method for substrate inspection, in accordance with some embodiments of the present disclosure. The method for substrate inspection may further include transferring the substrate to the second position, and transferring the substrate from the second position to the first position.

According to some of the embodiments in the present disclosure, FIG. 2 to FIG. 9 are schematic drawings illustrating an apparatus during substrate inspection at various stages.

Figure 2:
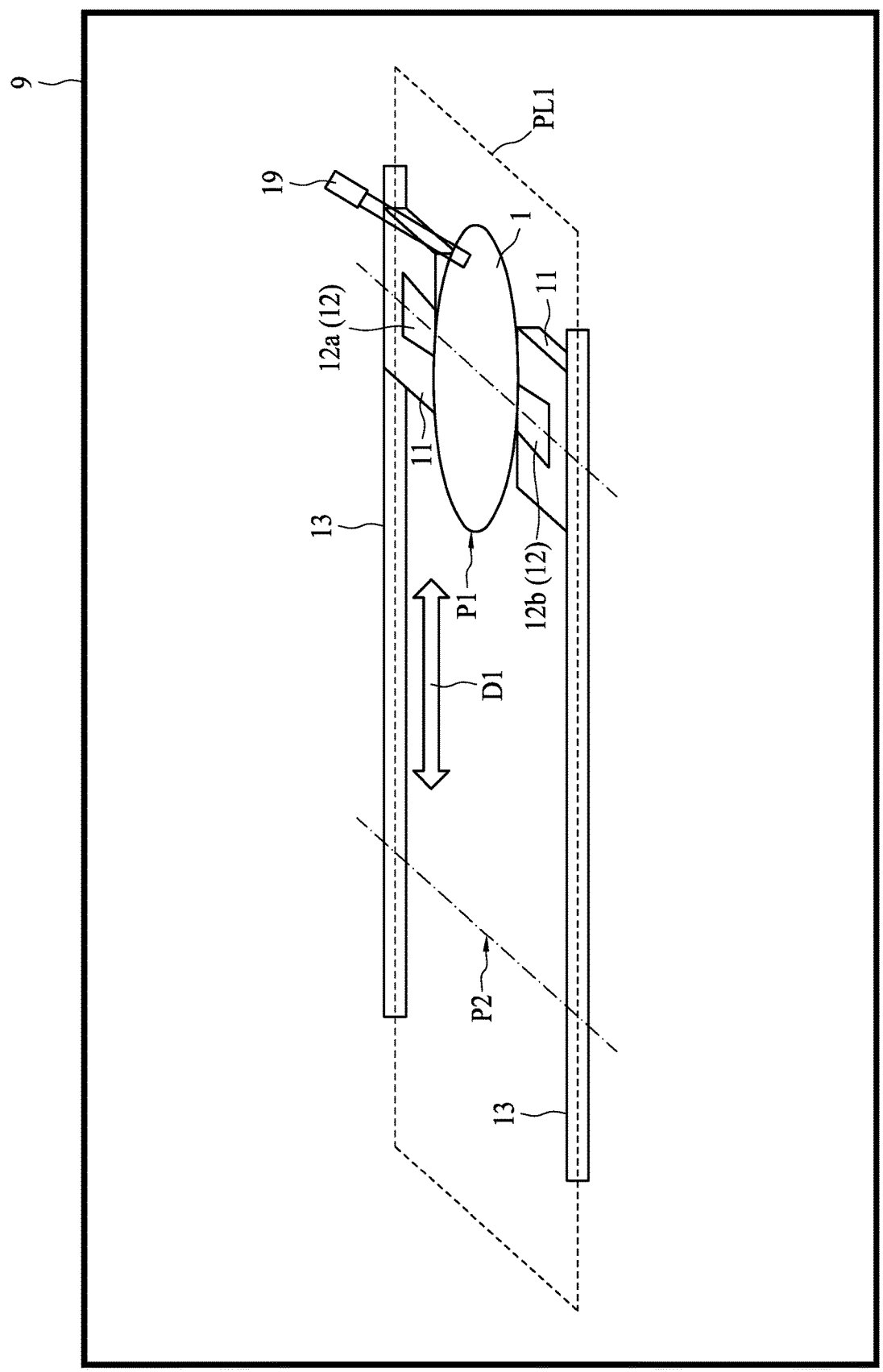
FIG. 2 is a schematic drawing illustrating an apparatus during substrate inspection at various stages in oblique view, in accordance with some embodiments of the present disclosure.

Referring to FIG. 1B and FIG. 2, FIG. 2 is a schematic drawing illustrating an apparatus during substrate inspection at various stages in oblique view, in accordance with some embodiments of the present disclosure. In operation 101, a substrate 1 is loaded and held by a movable holder 11 in a chamber 9, wherein a current position of the substrate 1 is hereinafter referred to the first position P1. The substrate 1 may be a wafer, for example a wafer having a size in a range from about 150 mm to about 200 mm, a panel, a semiconductive structure, or the like.

Figure 3A:
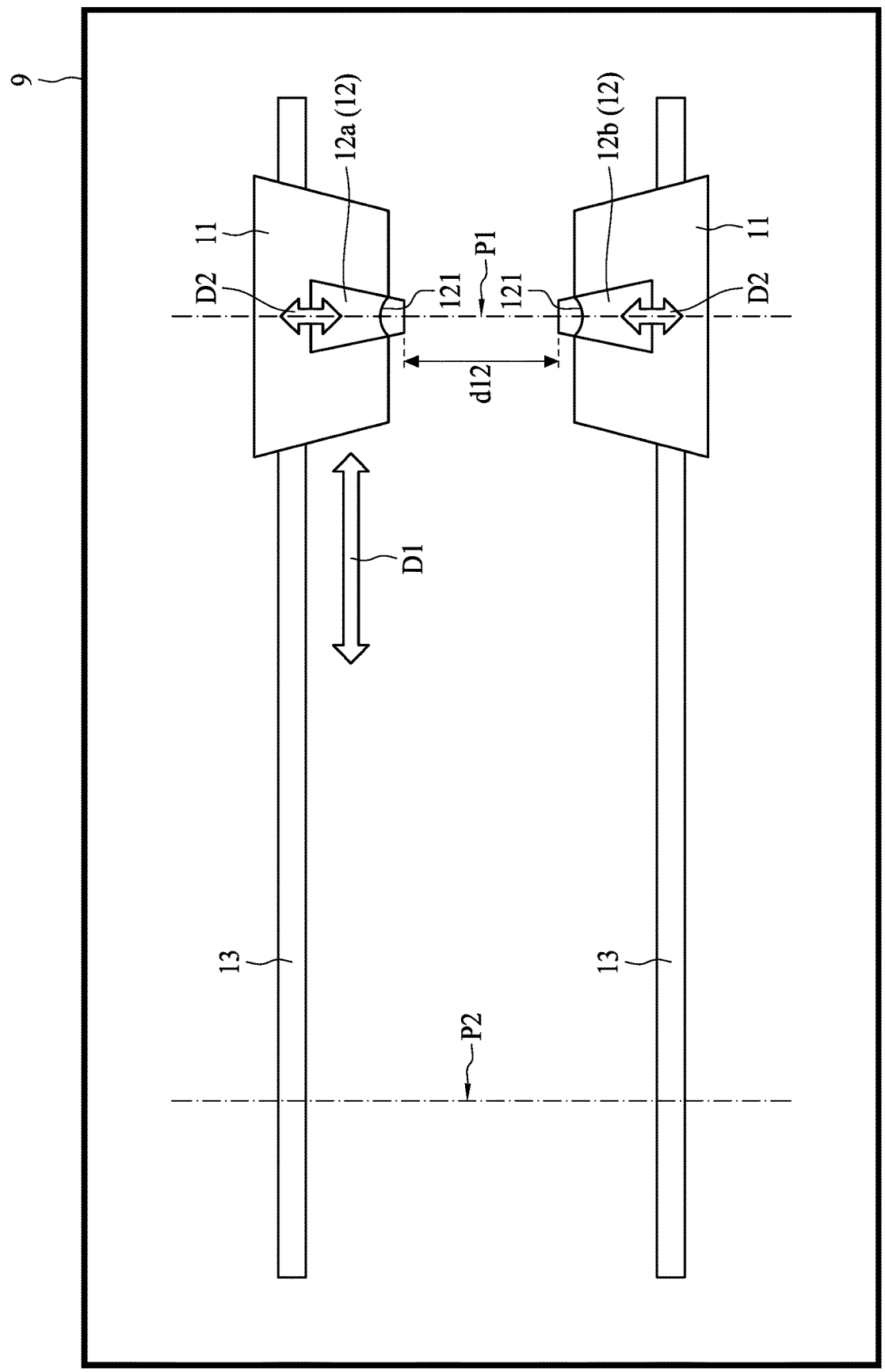
FIG. 3A is a schematic drawing illustrating an apparatus during substrate inspection at various stages in top view, in accordance with some embodiments of the present disclosure.
Figure 3B:
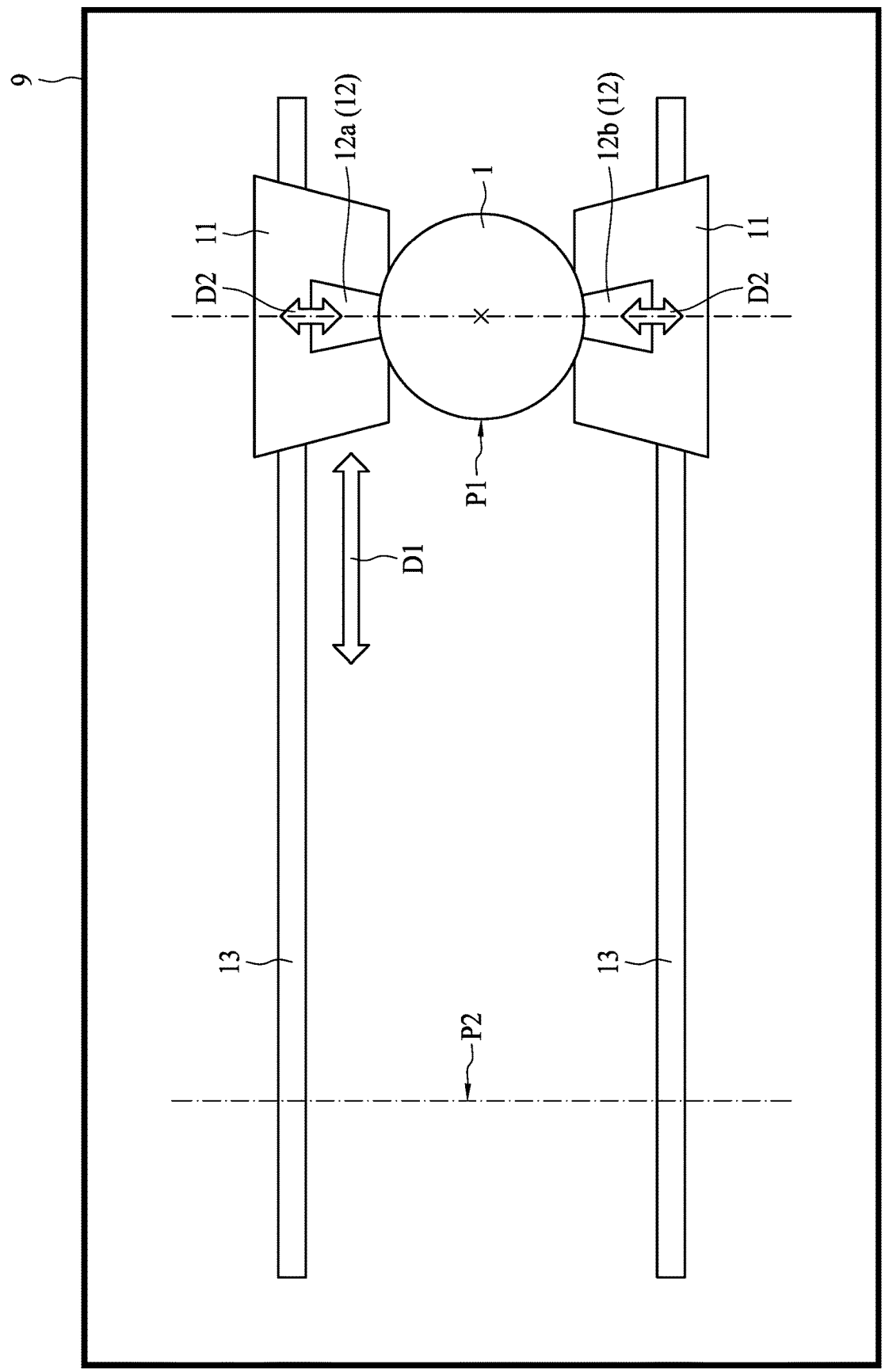
FIG. 3B is a schematic drawing illustrating an apparatus during substrate inspection at various stages in top view, in accordance with some embodiments of the present disclosure.
Figure 3C:
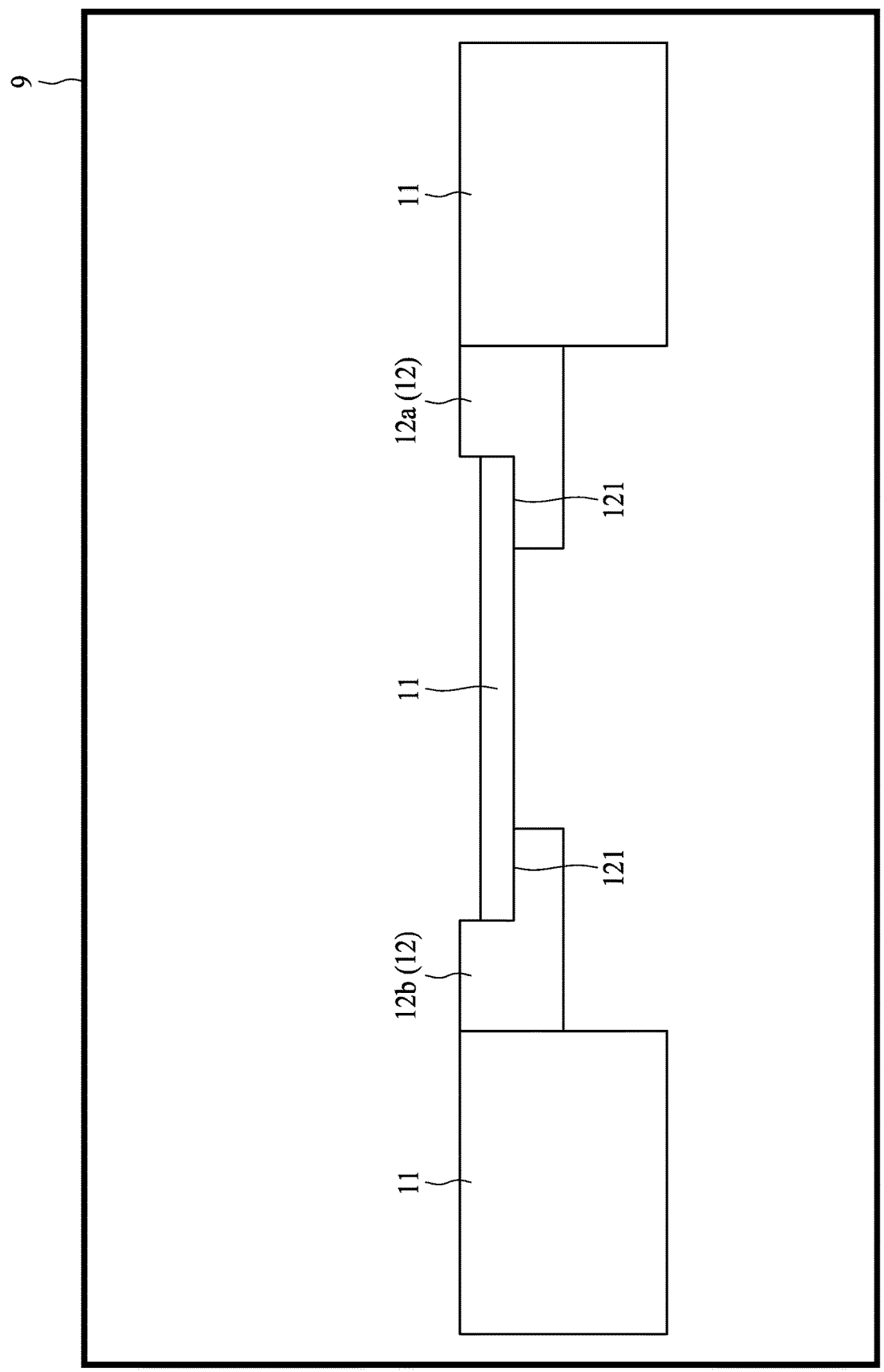
FIG. 3C is a schematic drawing illustrating an apparatus during substrate inspection at various stages in side view, in accordance with some embodiments of the present disclosure.

Referring to FIG. 1B, FIG. 3A, FIG. 3B and FIG. 3C, FIG. 3A and FIG. 3B are schematic drawings illustrating an apparatus during substrate inspection at various stages in top view, and FIG. 3C is a schematic drawing illustrating an apparatus during substrate inspection at various stages in side view, in accordance with some embodiments of the present disclosure. In some embodiments, in order to perform backside inspection of the substrate 1, as will be subsequently discussed in sub-operation 103, a portion of the backside of the substrate 1 is exposed from the movable holder 11. In some embodiments, the movable holder 11 may include two portions synchronously transfer along the guiding linkage 13. In some embodiments, the movable holder 11 may further include a retractable arm 12 to receive and accommodate the substrate 1 in operation 101. A configuration of the retractable arm 12 may be adjusted, in some embodiments automatically, in accordance with a predetermined size of the substrate 1, thus the retractable arm 12 may accommodate various sizes of the substrate 1, for example, 6-inch substrate, 8-inch substrate, 12-inch substrate, 18-inch substrate, a wafer having a size in a range from about 150 mm to about 200 mm, but the present disclosure is not limited thereto. The retractable arm 12 may be adjusted prior to loading the substrate 1. The retractable arm 12 may include a pair of arms such as a first arm 12a and a second arm 12b, wherein a distance d12 is spacing between the first arm 12a and the second arm 12b. The first arm 12a and the second arm 12b can be moved along a radial direction D2 of the substrate 1, departing from or approaching toward each other, in order to adjust the distance d12. The distance d12 may be adjusted to expose a predetermined portion of the backside of the substrate 1 for backside inspection; while a contact area of the substrate 1 and the retractable arm 12 is great enough to significantly decrease the risk of the substrate 1 dropping off the retractable arm 12. The first arm 12a and the second arm 12b may further include one or more grooves 121 to ameliorate the secureness of the substrate 1 on the retractable arm 12. The grooves 121 may be configured to conform to a portion of the contour of the substrate 1. In some embodiments, the grooves 121 may be on a plane different from a top surface of the retractable arm 12, as shown in FIG. 3C. In some embodiments, a plurality of the grooves 121 may be configured on various planes, on a curved plane, or on a slope, in order to accommodate various contours of the substrate 1.

Figure 3D:
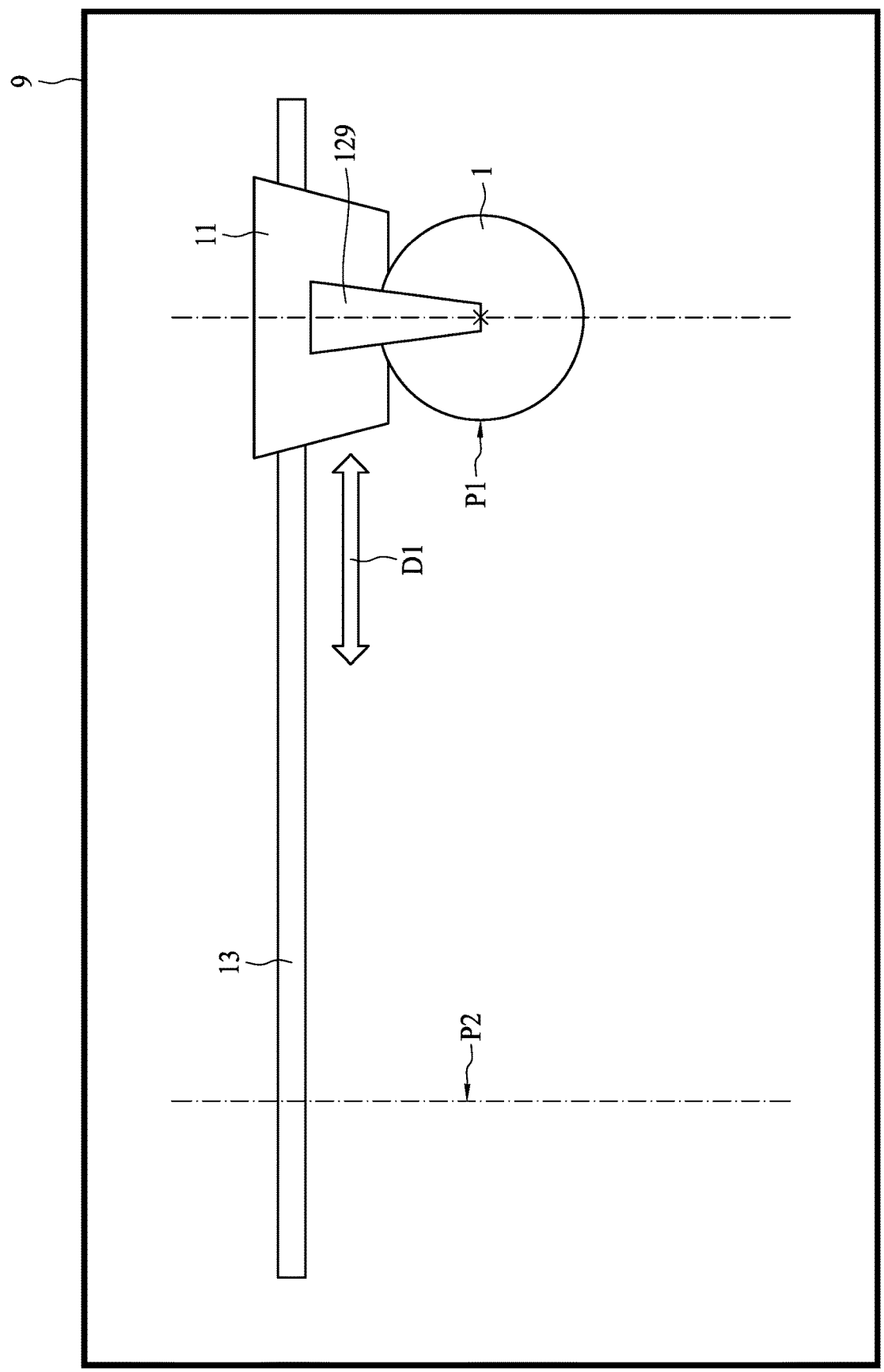
FIG. 3D is a schematic drawing illustrating an apparatus during substrate inspection at various stages in top view, in accordance with some embodiments of the present disclosure.

Referring to FIG. 1B and FIG. 3D, FIG. 3D is a schematic drawing illustrating an apparatus during substrate inspection at various stages in top view, in accordance with some embodiments of the present disclosure. FIG. 3D illustrates some other embodiments of accommodating the substrate 1 on the movable holder 11 in order to expose a portion of the backside of the substrate 1. In some embodiments, the movable holder 11 may further include a securing arm 129 to receive and accommodate the substrate 1 by securing the substrate 1 from the frontside in operation 101. A position of the securing arm 129 may be adjusted, in some embodiments retractable or rotatable, in accordance with a predetermined size of the substrate 1 prior to loading the substrate 1. The securing arm 129 may include one or more arms having a securing mechanism, such as vacuum suction. The securing arm 129 may receive the substrate 1 at a predetermined position and release the substrate 1 at another predetermined position, wherein the securing arm 129 may, or may not be moved or rotated during receiving or releasing the substrate 1. By securing the substrate 1 from the frontside, the exposed portion of the backside of the substrate 1 can be increased.

Referring back to FIG. 1B and FIG. 2, in operation 102, the substrate 1 is transferred from the first position P1 to a second position P2. The movable holder 11 is disposed on a guiding linkage 13, wherein the movable holder 11 may transfer along the guiding linkage 13. In some embodiments, the guiding linkage 13 may be one or more leadscrew, rack, rail, belt gear, chain, motion actuators, or the like. In some embodiments, the guiding linkage 13 is in the chamber 9. For exemplary demonstration, a plurality of leadscrews is used as the guiding linkage 13 in FIG. 2, but the present disclosure is not limited thereto. The route of the guiding linkage 13 is configured to comply with adjacent mechanisms or modules, the guiding linkage 13 may thus be accordingly disposed on a flat plane, a slant plane, a curved plane, a crooked plane, or the like. In some embodiments, the first position P1 and the second position P2 are on a first imaginary plane PL1, as the first position P1 of the substrate 1 may be transferred along a first imaginary plane PL1. For exemplary demonstration, the guiding linkage 13 constructs a straight route parallel or along the first imaginary plane PL1, thus the substrate 1 may transfer along a direction D1 (both ways) along the first imaginary plane PL1 between the first position P1 and a second position P2.

Referring to FIG. 2, in some embodiments, a presence detection sensor 19 is further configured to detect whether the substrate 1 is mounted on the movable holder 11. When the substrate 1 is in the first position P1, the presence detection sensor 19 may help to verify the presence of the substrate 1 on the movable holder 11, decreasing the risk of loading two or more substrates 1 onto the movable holder 11. In some embodiments, the presence detection sensor 19 may move synchronously with the movable holder 11 or the transferring path of the substrate 1, verifying if the substrate 1 is still secured throughout the inspection operation. The presence detection sensor 19 may, or may not be disposed on the movable holder 11.

Figure 4A:
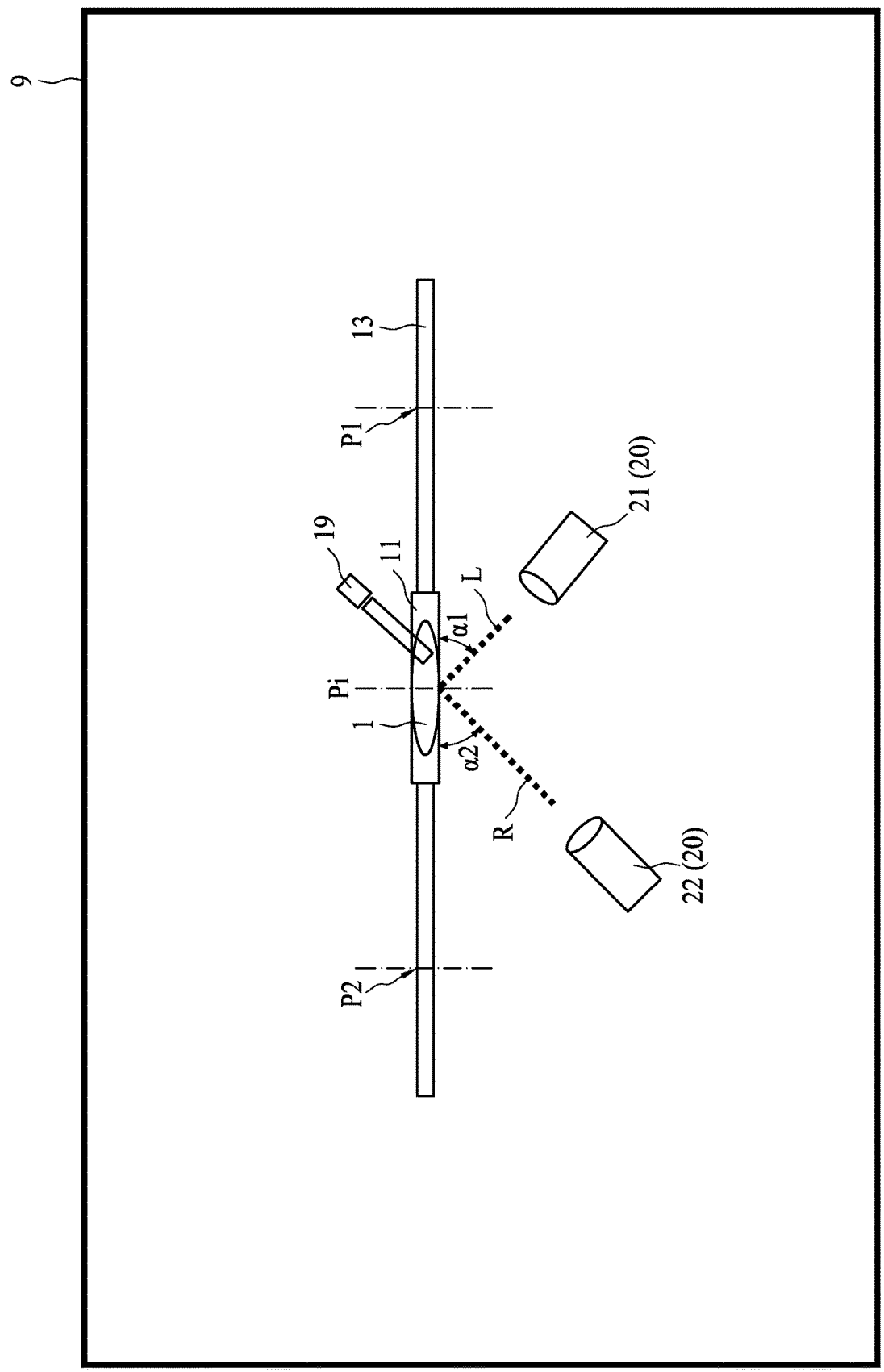
FIG. 4A is a schematic drawing illustrating an apparatus during substrate inspection at various stages in side view, in accordance with some embodiments of the present disclosure.

Referring to FIG. 1B and FIG. 4A, FIG. 4A is a schematic drawing illustrating an apparatus during substrate inspection at various stages in side view, in accordance with some embodiments of the present disclosure. The operation 102 further includes a sub-operation 103, wherein backside inspection on the backside of the substrate 1 in the chamber 9 is performed during the substrate 1 being transferred from the first position P1 to the second position P2. A backside inspector 20 (or referred to as a first inspector) is configured in the chamber 9, under the first position P1 and the second position P2 for inspecting the backside of the substrate 1. In some embodiments, as shown in FIG. 4A, the backside inspector 20 includes a light source 21 and a first light receiver 22. The light source 21 emit a light L toward the backside of the substrate 1 when the substrate 1 transfers through an intermediate position Pi between the first position P1 and the second position P2, and the backside of the substrate 1 may reflect the light L. The light L may include visible light, ultraviolet light, infrared light, laser, diode laser, helium neon laser, argon laser, solid state laser, broadband light, monochromatic light, polarized light, or other light which light receivers can be responsive thereto. Thence the surface roughness of the backside of the substrate 1 may be obtained by detecting a reflected light R thereof, further inferring the mapping of defects such as particles, residual films, slurry, peeling, cracks, containments, non-uniform surface, or damages induced on the backside of the substrate 1. In order to obtain the surface roughness of the backside of the substrate 1, the light L emitted from the light source 21 scans through the backside of the substrate 1 at a first angle $\alpha 1$, and the first light receiver 22 receives the reflected light R from the backside of the substrate 1 at a second angle $\alpha 2$, as the luminous exitance, luminous flux, luminous intensity, luminance, and/or the luminance energy thereof can be obtained. In some embodiments, one or more of the illumination optics such as reflection mirror, lenses, mirrors, beam splitters, beam expanders, polarizers, wave plates, or the like may be positioned in light paths of the light L toward the substrate 1 and/or reflected light R from the substrate 1 to alter the path per se or the properties thereof. The aforesaid luminous exitance, luminous flux, luminous intensity, luminance, and/or the luminance energy obtained herein may be adjusted according to the properties of illumination optics interposed in the light paths.

By comparing the light L emitted from the light source 21 and the reflected light R received by the first light receiver 22, a mapping of the backside of the substrate 1 may be obtained. In some embodiments, the first angle $\alpha 1$ equals to the second angle $\alpha 2$, wherein the loss portions of the luminous exitance, luminous flux, luminous intensity, luminance, and/or the luminance energy thereof may indicate the locations of the defects such as particles, residual films, slurry, peeling, cracks, containments, non-uniform surface, or damages induced on the backside of the substrate 1. In some other embodiments, the first angle α1 is different from the second angle α2, for one of the examples, the first angle α1 less than 90 degrees while the second angle α2 is perpendicular to the backside of the substrate 1, the first light receiver 22 may receive the reflected light R reflected by surface roughness or defects, as the locations of the defects such as particles, residual films, slurry, peeling, cracks, containments, non-uniform surface, or damages induced on the backside of the substrate 1 may be indicated. In some embodiments, the light source 21 and the first light receiver 22 are fixed in the chamber 9. In some embodiments, the backside inspector 20 is immobilized when inspecting the backside of the substrate 1, therefore mechanisms for controlling a position of the backside inspector 20 may not be entailed herein, and thus the cost of the backside inspector 20 can be reduced.

In some embodiments, the light source 21 and the first light receiver 22 may be used for acquiring a bright field mapping of the backside of the substrate 1. Since the defects on the projected surface, such as contamination defect, particles, chuck marks, or the like, may reflect the light L, thence the defects can be detected by comparing to the substantially flat surface reflecting the light L.

In some other embodiments, the light source 21 and the first light receiver 22 may be used for acquiring a dark field mapping of the substrate 1. Under the aforesaid bright field inspection, some of the defects, such as scratches or particles, may not be defected since the reflected light R reflected off such defects may still be received by the first light receiver 22. Therefore, the light source 21 may be disposed in a fashion which can allow the reflected light R reflected off the defects, which may appear as bright area under dark field inspection. Herein the flat surface of the backside of the substrate 1 may be appeared as dark background under dark field inspection thence the defects can be contrasted easier.

In some embodiments, the first light receiver 22 is a charge coupled device (CCD). In some embodiments, the light source 21 and the first light receiver 22 are incorporated as a line scan camera. Line scan cameras may capture images one line at a time as the substrate 1 transferring pass the intermediate position Pi. A continuous series of pixelated images is obtained, as the pixel capturing rate is in sync with a transferring speed of the substrate 1. The continuous series of pixelated images may form a two-dimensional image data, as the aforesaid locations of the defects may be mapped out. In some embodiments, the width of the collective continuous series of pixelated images may be equal to or wider than a width of the substrate 1, a diameter of the substrate 1, or the distance d12 previously illustrated in FIG. 3A. By utilizing the CCD or the line camera, the complete defect mapping of the exposed surface can be obtained by transferring the substrate 1 to pass through the intermediate position Pi. The efficiency of inspecting may be significantly enhanced since solely a single line of data entails to be transferred out before the next exposure.

However, the type of the backside inspector 20 is not limited thereto. Other suitable detectors for detecting defects while complying with the configuration of the apparatus for defect inspection, such as time delay integration (TDI) camera, array detector, area scan camera, or the like, may also be under consideration.

Figure 4B:
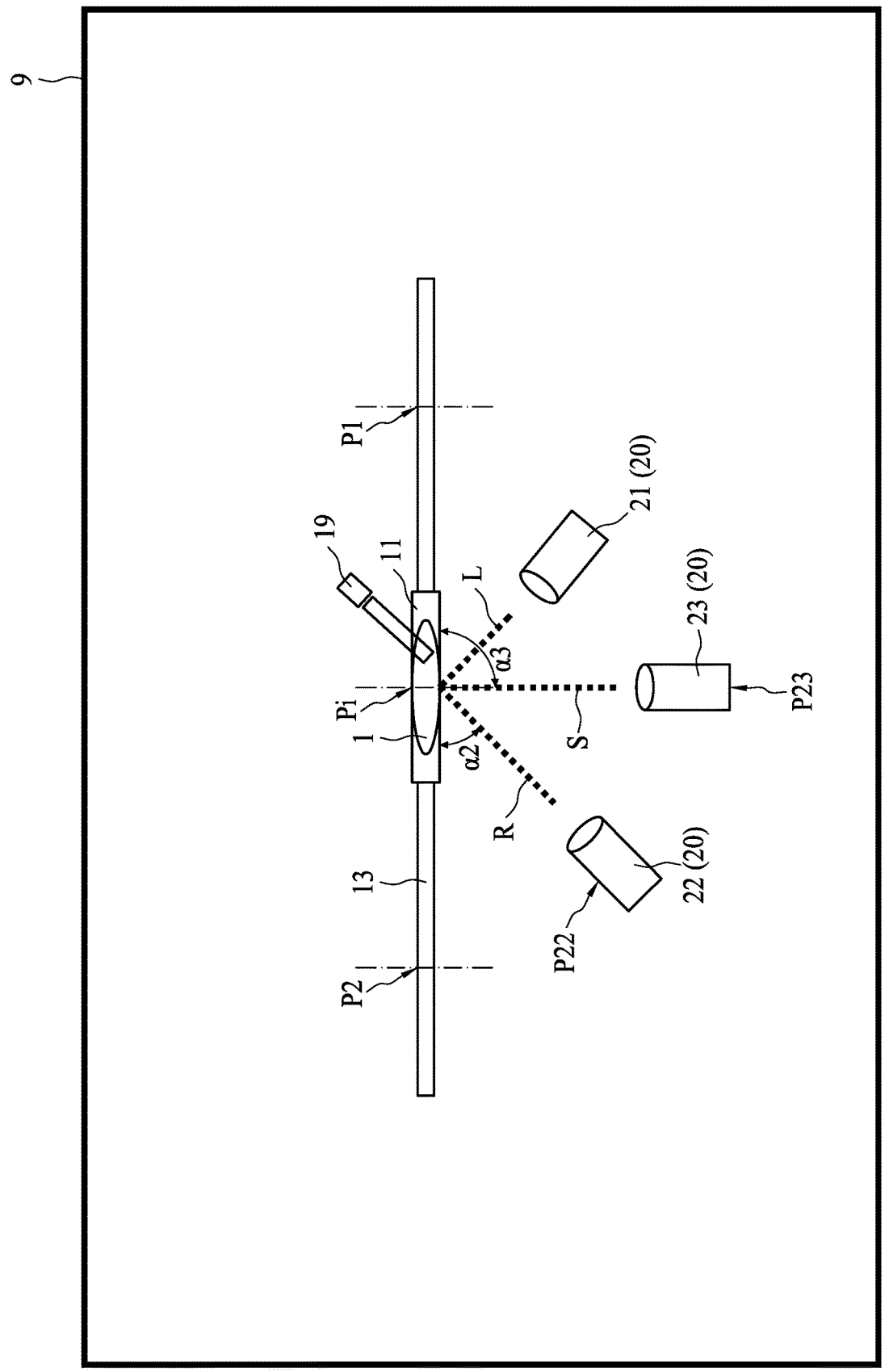
FIG. 4B is a schematic drawing illustrating an apparatus during substrate inspection at various stages in side view, in accordance with some embodiments of the present disclosure.

Referring to FIG. 4B, FIG. 4B is a schematic drawing illustrating an apparatus during substrate inspection at various stages in side view, in accordance with some embodiments of the present disclosure. In some embodiments, the backside inspector 20 includes one or more light sources and/or a plurality of light receivers. For exemplary demonstration herein, the embodiments illustrated in FIG. 4B include the first light receiver 22 disposed at a first location P22 and facing the backside of the substrate 1 with the second angle α2, and a second light receiver 23 disposed at a second location P23 and facing the backside of the substrate 1 with a third angle α3. In some embodiments, the first light receiver 22 detects the loss portions of the luminous exitance, luminous flux, luminous intensity, luminance, and/or the luminance energy thereof may indicate the locations of the defects such as particles, residual films, slurry, peeling, cracks, containments, non-uniform surface, or damages induced on the backside of the substrate 1. While the second light receiver 23 receives scattered light S reflected by surface roughness or defects, as the locations of the defects such as particles, residual films, slurry, peeling, cracks, containments, non-uniform surface, or damages induced on the backside of the substrate 1 may be indicated.

In some embodiments, the first light receiver 22 receives a bright field mapping of the backside of the substrate 1 by monitoring the reflected light R and the second light receiver 23 receives a dark field mapping of the backside of the substrate 1 by monitoring the scattered light S. The reflected light R and the scattered light S may be able to respectively infer a loss portion and a scattered portion of the light L. Thence the bright field mapping and the dark field mapping of the backside of the substrate 1 can be obtained simultaneously, as the efficiency of defect detection and the accuracy of the defect mapping may be improved. It is noteworthy that herein the first angle α1 and the second angle α2 may be different.

In some embodiments, the one or more light sources and/or a plurality of light receivers are fixed in the chamber 9. In some embodiments, the backside inspector 20 is immobilized when inspecting the backside of the substrate 1, therefore mechanisms for controlling a position of the backside inspector 20 may not be entailed herein, and thus the cost of the backside inspector 20 can be reduced.

Figure 4C:
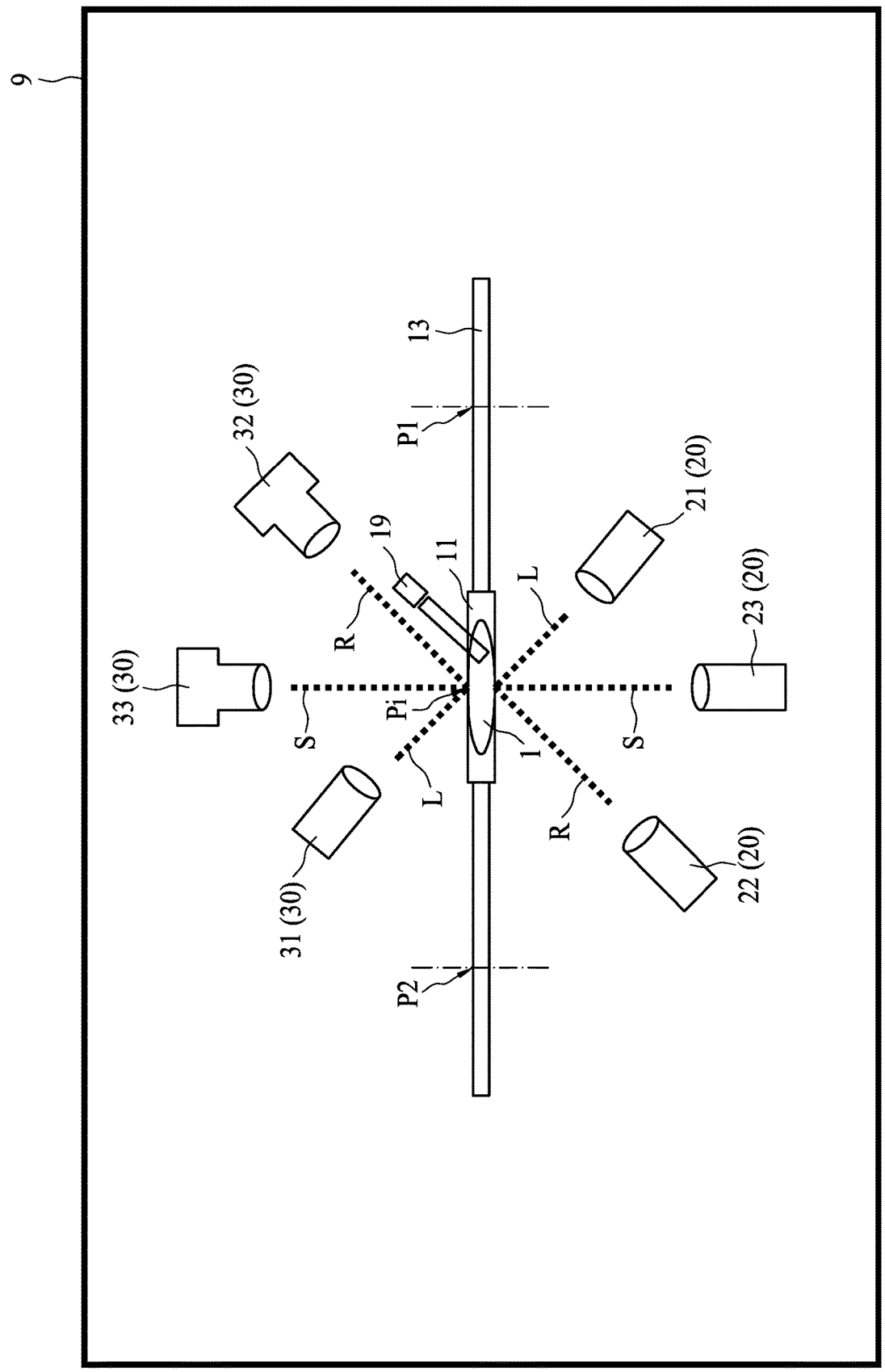
FIG. 4C is a schematic drawing illustrating an apparatus during substrate inspection at various stages in side view, in accordance with some embodiments of the present disclosure.

Referring to FIG. 1B and FIG. 4C, FIG. 4C is a schematic drawing illustrating an apparatus during substrate inspection at various stages in side view, in accordance with some embodiments of the present disclosure. In some embodiments, the operation 102 further includes a sub-operation 104, wherein a frontside inspection on a frontside of the substrate 1 is performed by a frontside inspector (or referred to as a third inspector) 30 over the first position P1 and the second position P2 in the chamber 9 during the substrate 1 being transferred from the first position P1 to the second position P2. The sub-operation 104 may be performed concurrently, prior to, or subsequent to sub-operation 103. Time duration of performing both frontside inspection and backside inspection may be significantly reduced. However, note that in some other embodiments, one of the sub-operation 103 and the sub-operation 104 may be selectively performed in operation 102. The configuration and principle of the frontside inspector 30 may be similar to the backside inspector 20 previously discussed in FIG. 4A or FIG. 4B, wherein the frontside inspector 30 may include at least one frontside light source 31 and at least one frontside light receiver 32. In some embodiments, the frontside inspector 30 may further include more than one frontside light receiver 32 to ameliorate the accuracy of defect mapping on frontside. In some embodiments, the frontside inspector 30 may, or may not further include one or more of the illumination optics such as lenses, mirrors, beam splitters, beam expanders, polarizers, wave plates, or the like.

In some embodiments, at least one of the frontside light receiver 32 receives a bright field mapping of the backside of the substrate 1 and at least another one of the frontside light receiver 32 receives a dark field mapping of the backside of the substrate 1. Thence the bright field mapping and the dark field mapping of the frontside as well as the backside of the substrate 1 can be obtained simultaneously, as the efficiency of defect detection and the accuracy of the defect mapping may be improved.

In some embodiments, the frontside light receiver 32 is a charge coupled device (CCD). In some embodiments, the frontside light source 31 and the frontside light receiver 32 are incorporated, as the frontside inspector 30 is a line scan camera. In some embodiments, the frontside light source 31 and the frontside light receiver 32 are fixed in the chamber 9. In some embodiments, the frontside inspector 30 is immobilized when inspecting the frontside of the substrate 1, therefore mechanisms for controlling a position of the frontside inspector 30 may not be entailed herein, and thus the cost of the frontside inspector 30 can be reduced.

Figure 4D:
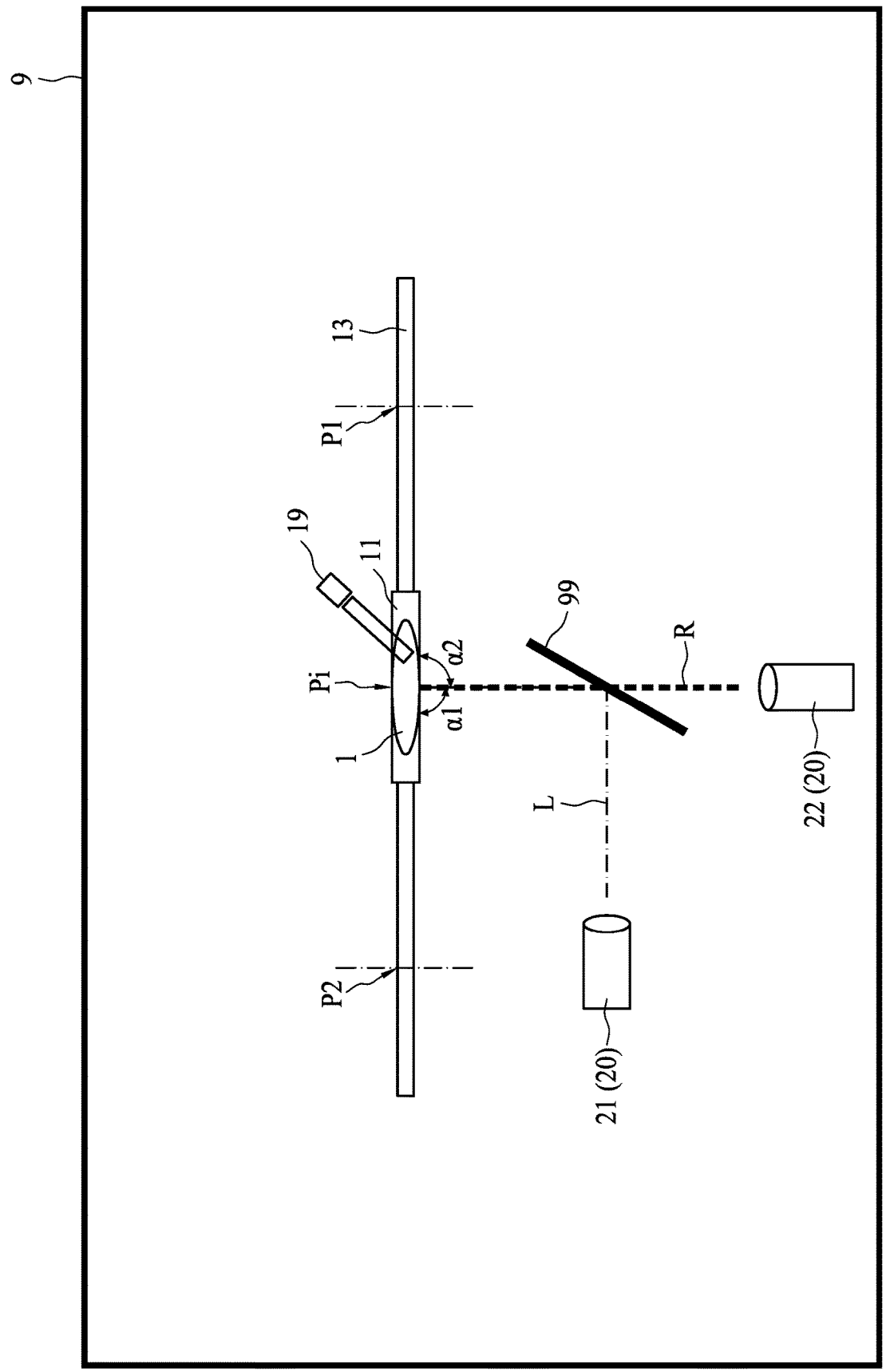
FIG. 4D is a schematic drawing illustrating an apparatus during substrate inspection at various stages in side view, in accordance with some embodiments of the present disclosure.

Referring to FIG. 1B and FIG. 4D, FIG. 4D is a schematic drawing illustrating an apparatus during substrate inspection at various stages in side view, in accordance with some embodiments of the present disclosure. In some embodiments, an optical mirror 99 can be interposed on the light path of the light L and/or the reflected light R to alter the light path thereof. In some embodiments, the first angle $\alpha 1$ and the second angle $\alpha 2$ may be substantially equal to 90 degree. But the disclosure is not limited thereto, the optical mirror 99 can be used in the embodiments discussed in this disclosure to alter the light path of the light L, the reflected light R, and/or the scattered light S in order to improve the accuracy or the efficiency of defect detection operation, or by virtue of the configuration of the chamber 9.

Figure 5A:
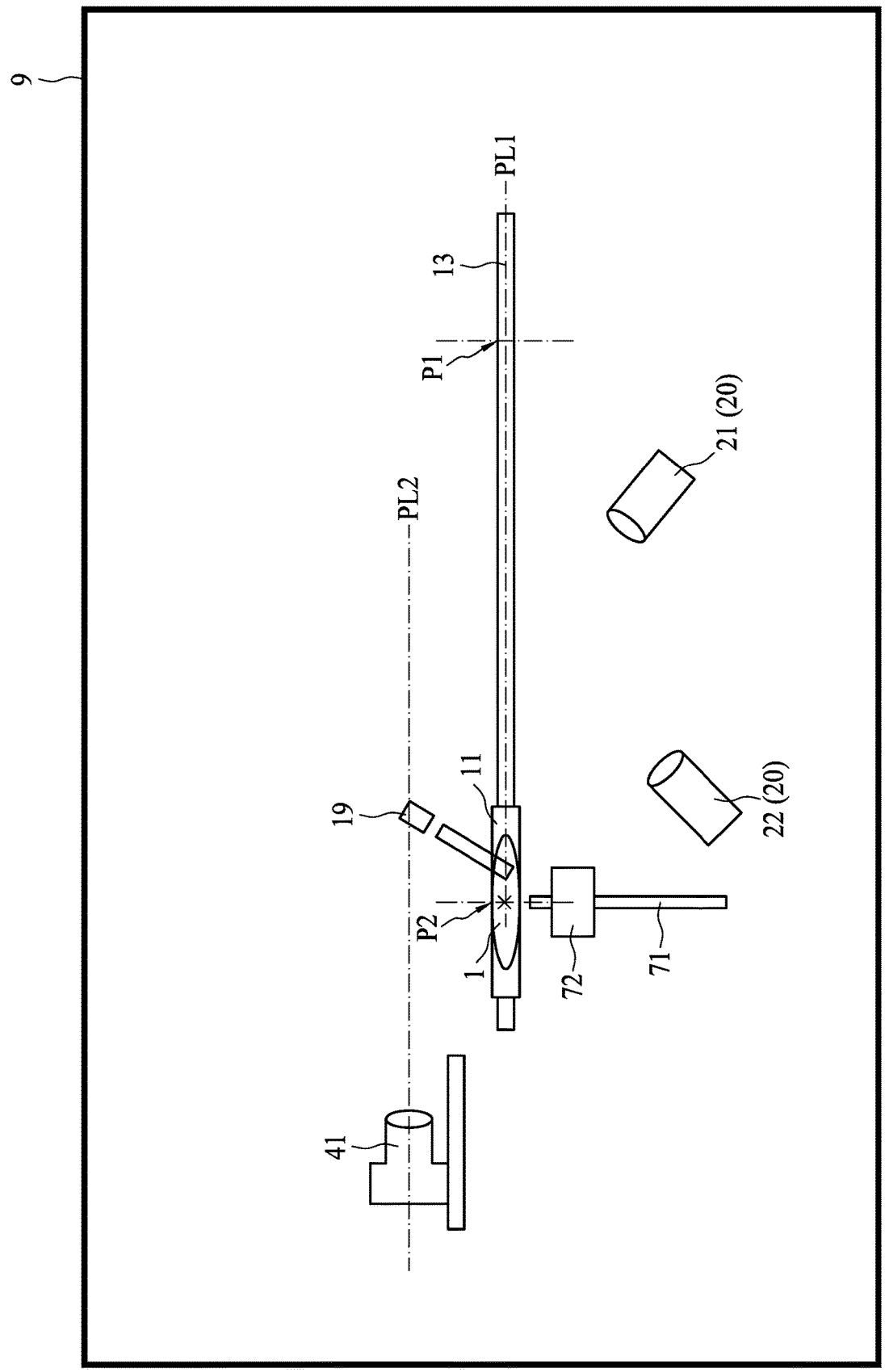
FIG. 5A is a schematic drawing illustrating an apparatus during substrate inspection at various stages in side view, in accordance with some embodiments of the present disclosure.

Referring to FIG. 1B and FIG. 5A, FIG. 5A is a schematic drawing illustrating an apparatus during substrate inspection at various stages in side view, in accordance with some embodiments of the present disclosure. Subsequent to performing sub-operation 103 and/or sub-operation 104, the substrate 1 is transferred to the second position P2 in the operation 102. In operation 105, a lifter 71 under the second position P2 and in the chamber 9 is configured to receive the substrate 1 from the retractable arm 12 illustrated in FIG. 3A and FIG. 3B, the movable holder 11, or the securing arm 129 illustrated in FIG. 3D, further accommodating and transferring the substrate 1. In some embodiments, the lifter 71 may further include a plurality of pins. In some embodiments, the lifter 71 may further include a securing mechanism (not shown in FIG. 5A) configured to secure the substrate 1. In some embodiments, the securing mechanism may include vacuum suction to reinforce the secureness of the substrate 1 on the lifter 71. In some embodiments, the securing mechanism contacts a portion of the backside of the substrate 1 exposed from the movable holder 11 and/or the retractable arm 12.

Figure 5B:
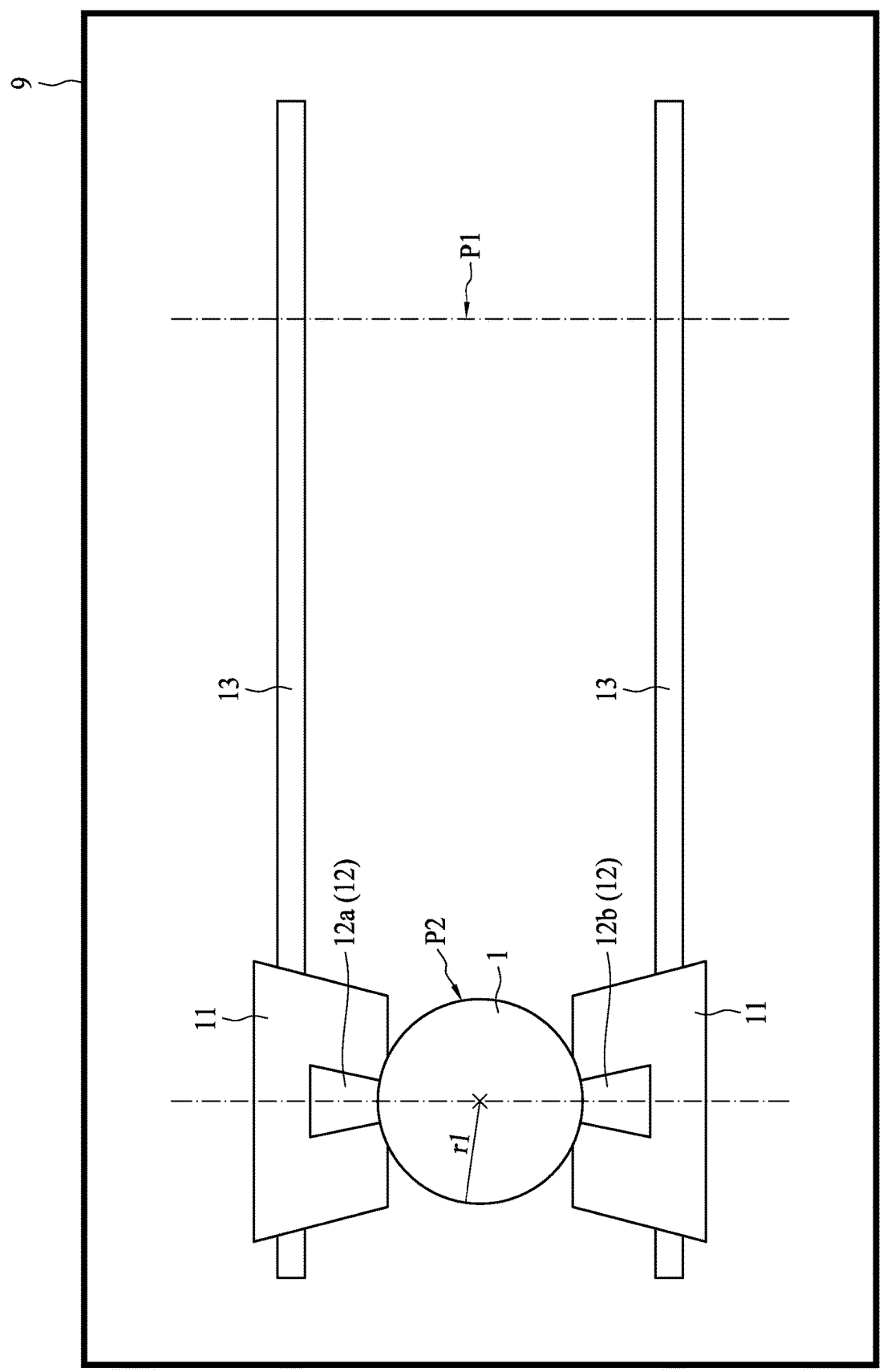
FIG. 5B is a schematic drawing illustrating an apparatus during substrate inspection at various stages in top view, in accordance with some embodiments of the present disclosure

Referring to FIG. 1B and FIG. 5B, FIG. 5B is a schematic drawing illustrating an apparatus during substrate inspection at various stages in top view, in accordance with some embodiments of the present disclosure. The substrate 1 is at a first orientation during the substrate 1 being transferred from the first position P1 to the second position P2 and set to be lifted and rotated by the lifter 71. In order to illustrate the rotation of the substrate 1, as will be subsequently discussed FIG. 6B to FIG. 7B, a first imaginary referential line r1 is used to indicate the first orientation before being rotated.

Figure 6A:
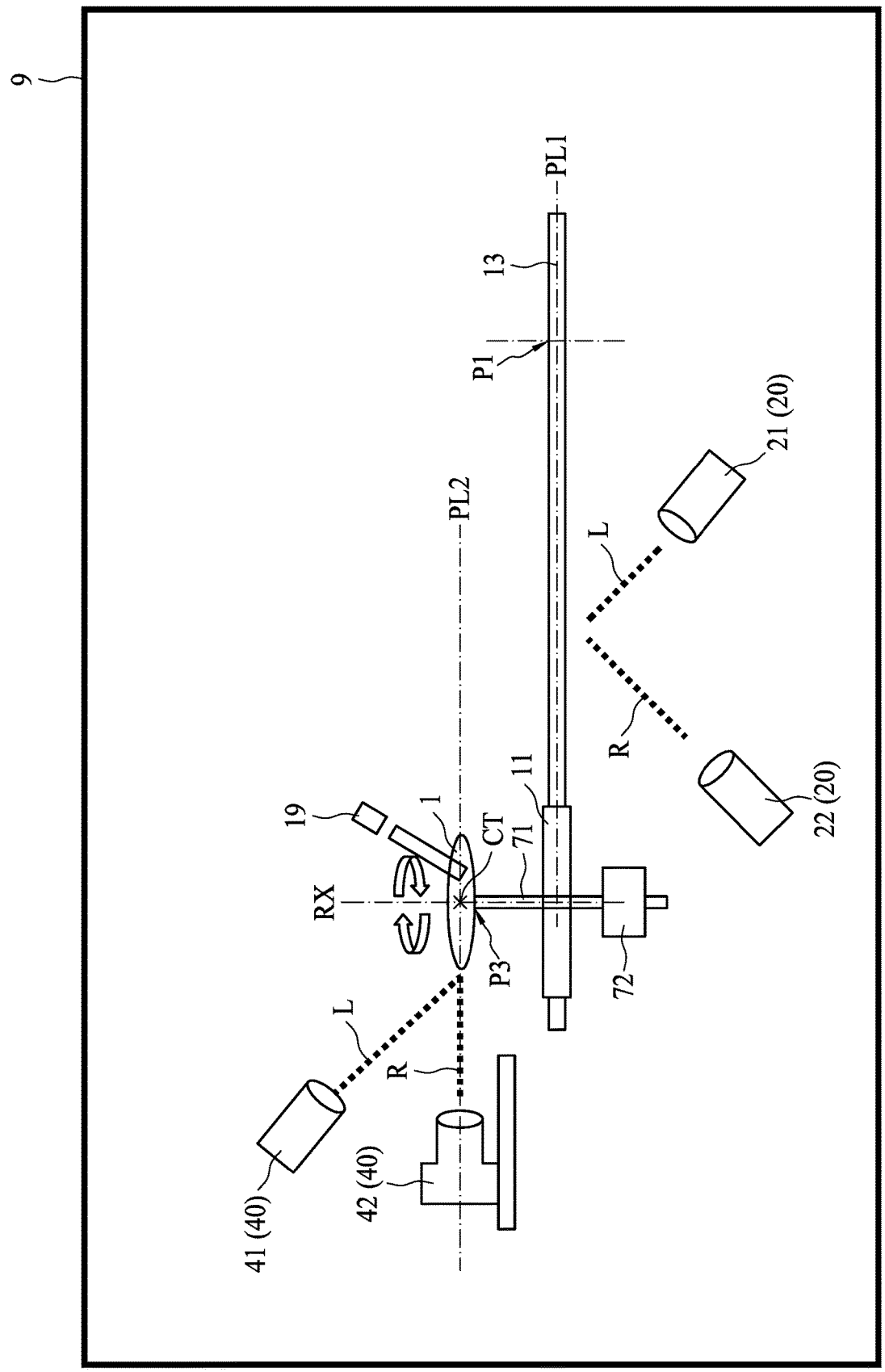
FIG. 6A is a schematic drawing illustrating an apparatus during substrate inspection at various stages in side view, in accordance with some embodiments of the present disclosure.

Referring to FIG. 1B and FIG. 6A, FIG. 6A is a schematic drawing illustrating an apparatus during substrate inspection at various stages in side view, in accordance with some embodiments of the present disclosure. The substrate 1 is transferred from the second position P2 to a third position P3 by the lifter 71, and further supported by the lifter 71 at the third position P3. An edge area of the substrate 1 is thus exposed and edge inspection can be performed on the edge of the substrate 1 in operation 107. As some of the embodiments illustrated in FIG. 2, the first position P1 and the second position P2 are on a first imaginary plane PL1, while the third position P3 is on a second imaginary plane PL2 different from the first imaginary plane PL1. In some embodiments, the second imaginary plane PL2 is over the first position P1 and the second position P2. In some other embodiments, the second imaginary plane PL2 may be below the first position P1 and the second position P2. In some embodiments, the movable holder 11 may be moved away subsequent to the lifter 71 receiving the substrate 1 at the second position P2 if interference may be induced.

In some embodiments, the presence detection sensor 19 may move synchronously with the substrate 1 to the second imaginary plane PL2, verifying if the substrate 1 is supported and secured by the lifter 71. In some other embodiments, the presence detection sensor 19 may not move synchronously with the substrate 1. The presence detection sensor 19 verifies if the substrate 1 is received and transferred away by the lifter 71.

Still referring to FIG. 6A, a second inspector 40 (or referred to as a second inspector) is disposed near the third position P3 to inspect the edge area of the substrate 1 when the substrate 1 is at the third position P3. The second inspector 40 includes an edge-side light source 41 and an edge-side light receiver 42. In some embodiments, the second inspector 40 including the edge-side light source 41 and the edge-side light receiver 42 are immobilized in the chamber 9, thus the lifter 71 further includes a rotational component 72 configured to rotate both the lifter 71 and the substrate 1. Thus edge inspection can be performed during the substrate 1 being rotated so that the edge area of the substrate 1 can be inspected without moving the second inspector 40, therefore mechanisms for controlling a position of the second inspector 40 may not be entailed herein, and the cost of the second inspector 40 can be reduced. In some embodiments, when the substrate 1 is supported and rotated by the lifter 71, the edge area of the substrate 1 is exposed. In some embodiments, the edge area may include at least one of the top bevel, bottom bevel, a portion of frontside near the edge, a portion of backside near the edge, apex, and/or a peripheral area adjacent to an edge bead removal (EBR) line. In some embodiments, the substrate 1 is rotated around a rotational axis RX penetrating a center CT of the substrate 1 thus the stability of rotating the substrate 1 may be ameliorated. The center CT of the substrate 1 may be a mass center of the substrate 1, a geometric center of the substrate 1, or a suitable predetermined location. In some embodiments, the second inspector 40, the edge-side light source 41, and the edge-side light receiver 42 may be similar to the backside inspector 20, the light source 21 and the first light receiver 22 previously discussed in FIG. 4A, respectively. In some embodiments, the second inspector 40 can be a line scan camera, or the like. In some embodiments, the second inspector 40 may, or may not further include one or more of the illumination optics such as lenses, mirrors, beam splitters, beam expanders, polarizers, wave plates, or the like. In some embodiments, the light receivers herein may be a charge coupled device (CCD).

Figure 6B:
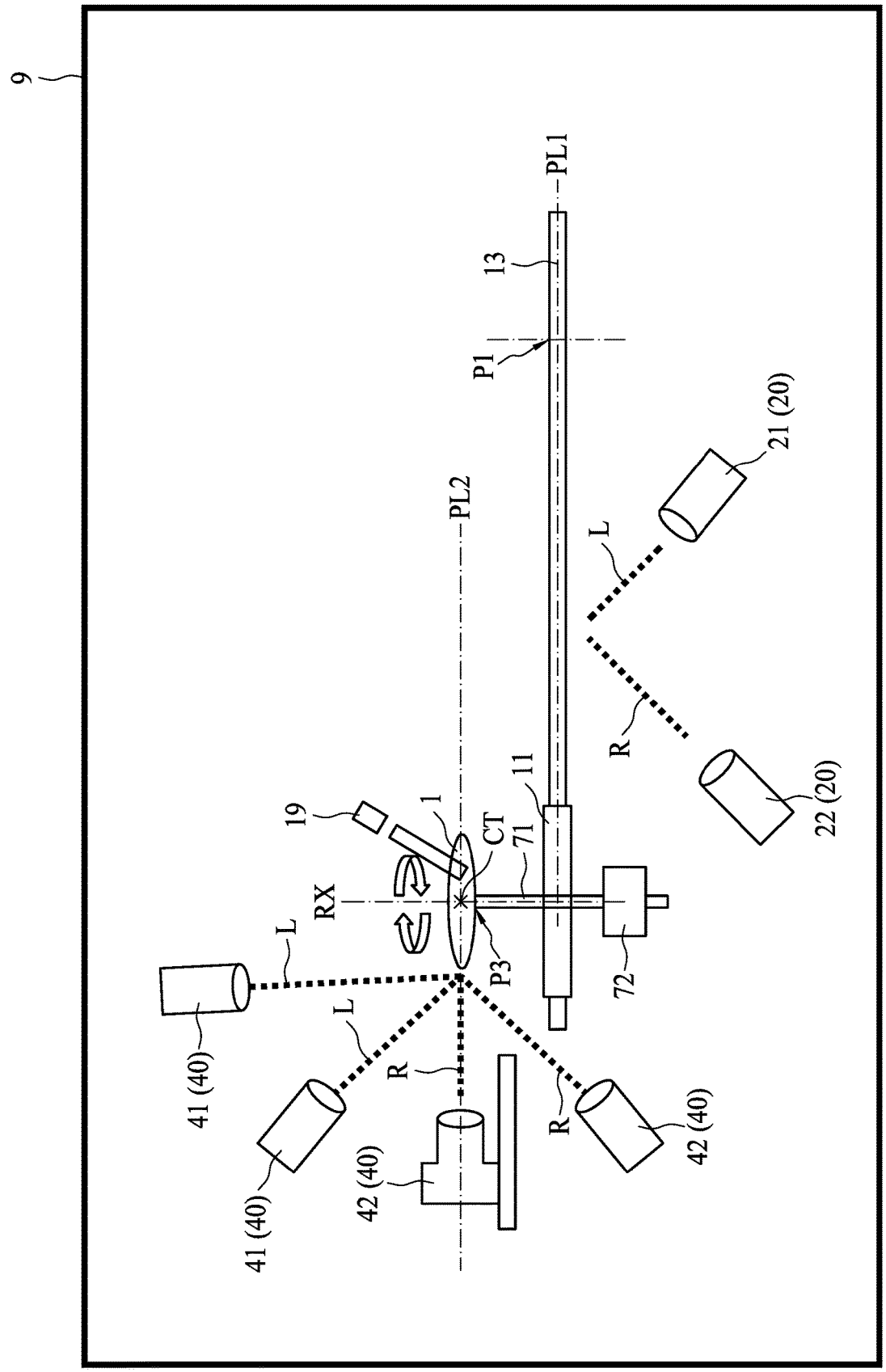
FIG. 6B is a schematic drawing illustrating an apparatus during substrate inspection at various stages in side view, in accordance with some embodiments of the present disclosure.

Referring to FIG. 6B, in some embodiments, a plurality of the edge-side light source 41, and the edge-side light receiver 42 can be incorporated, or one or more inspectors 40 may be further included, to ameliorate the accuracy of defect mapping in edge area since the edge area may include a plurality of different surfaces. The configurations of the light sources and the light receivers may be similar to the ones illustrated in FIG. 4B, as the reflection surface in FIG. 6B may be within the edge area.

Figure 7A:
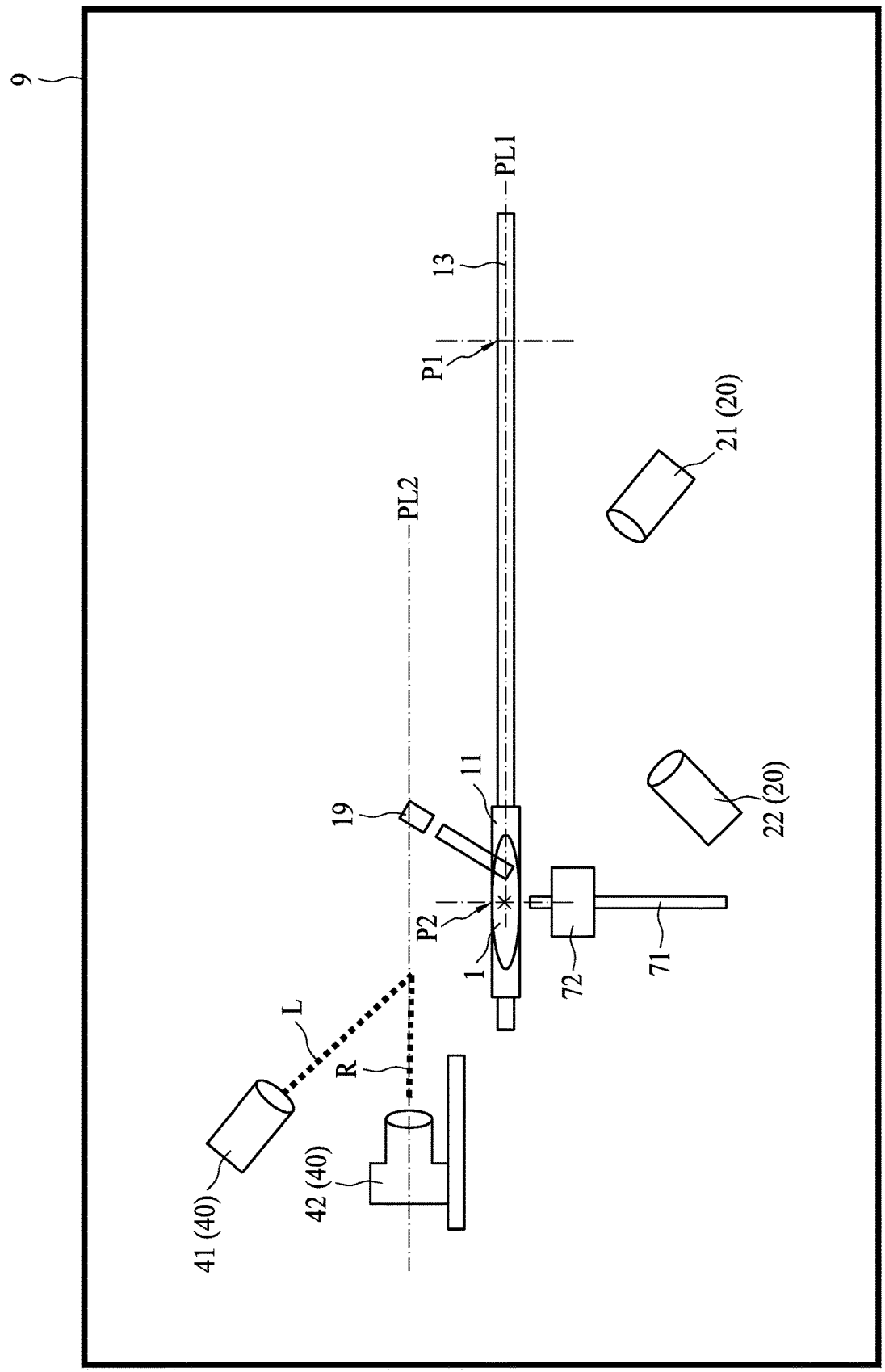
FIG. 7A is a schematic drawing illustrating an apparatus during substrate inspection at various stages in side view, in accordance with some embodiments of the present disclosure.
Figure 7B:
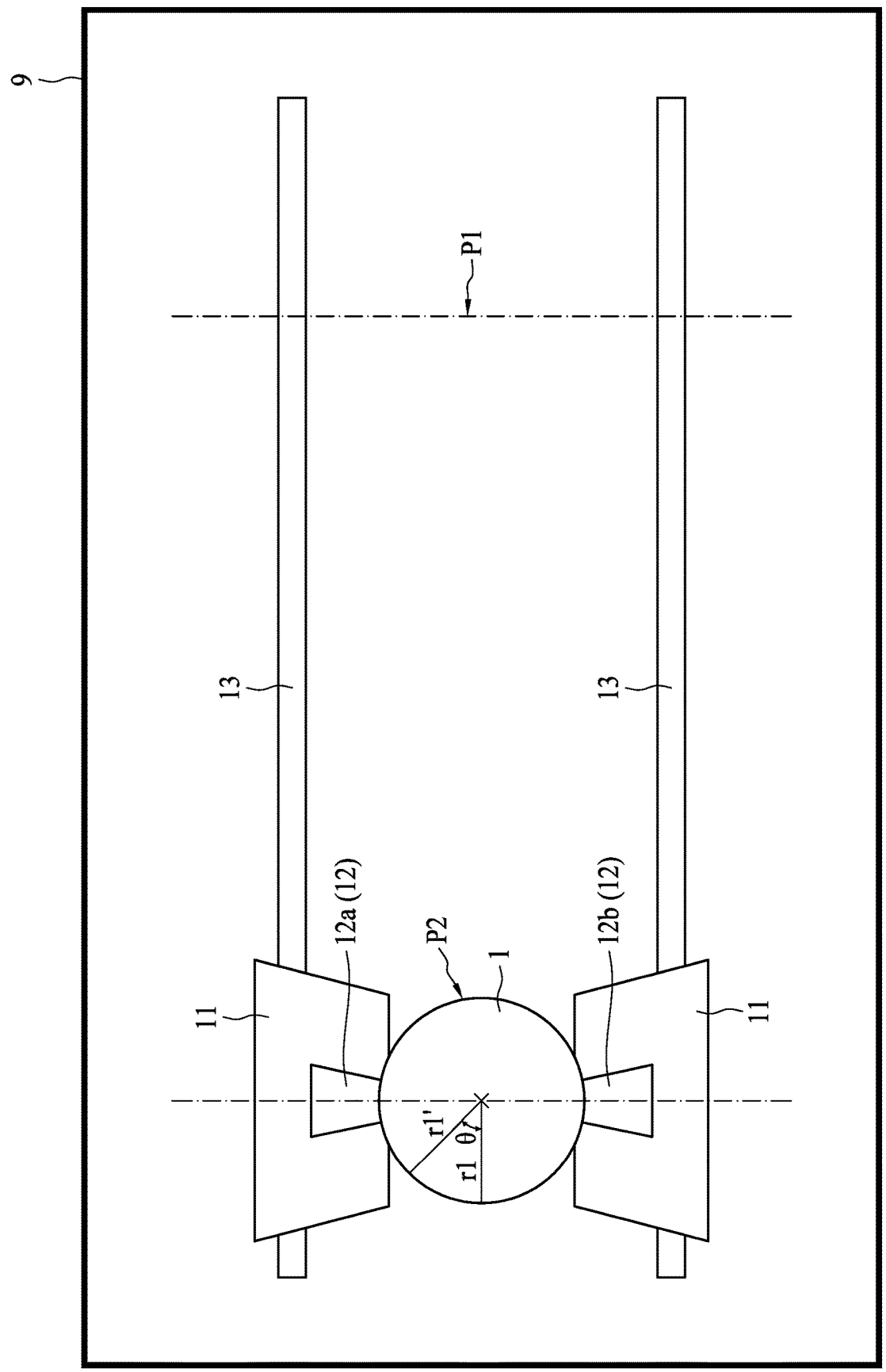
FIG. 7B is a schematic drawing illustrating an apparatus during substrate inspection at various stages in top view, in accordance with some embodiments of the present disclosure

Referring to FIG. 1B, FIG. 7A and FIG. 7B, FIG. 7A is a schematic drawing illustrating an apparatus during substrate inspection at various stages in side view, and FIG. 7B is a schematic drawing illustrating an apparatus during substrate inspection at various stages in top view, in accordance with some embodiments of the present disclosure. Subsequent to operation 107, the substrate 1 is transferred to the second position P2 by the lifter 71 in operation 109. In some embodiments, the substrate 1 is rotated to a second orientation by the lifter 71 prior to the operation 109 since a portion of the backside of the substrate 1 may be covered by the movable holder 11 or the retractable arm 12 in sub-operation 103, the covered portion of the backside of the substrate 1 may be exposed during backside inspection being performed again in operation 111 subsequent to the operation 109, as will be subsequently discussed in FIG. 8A to FIG. 8C. A fourth angle θ between the first orientation and the second orientation is illustrated as an angle between the first imaginary referential line r1 and a second imaginary referential line r1', wherein the second imaginary referential line r1' is the first imaginary referential line r1 being rotated from the first orientation to the second orientation. The fourth angle θ may be positive or negative, however, the fourth angle θ may comply with a range wherein the covered portion of the backside in sub-operation 103 can be exposed by the movable holder 11 or the retractable arm 12, for one of the examples, the fourth angle θ may be 90 degrees. In some embodiments, the fourth angle θ is greater than or less than zero.

In some embodiments, the presence detection sensor 19 may move synchronously with the substrate 1 back to the first imaginary plane PL1, verifying if the substrate 1 is supported and secured by the lifter 71. In some other embodiments, the presence detection sensor 19 may not move synchronously with the substrate 1. The presence detection sensor 19 verifies if the substrate 1 is received by the movable holder 11, the retractable arm 12, or the securing arm 129.

Figure 8A:
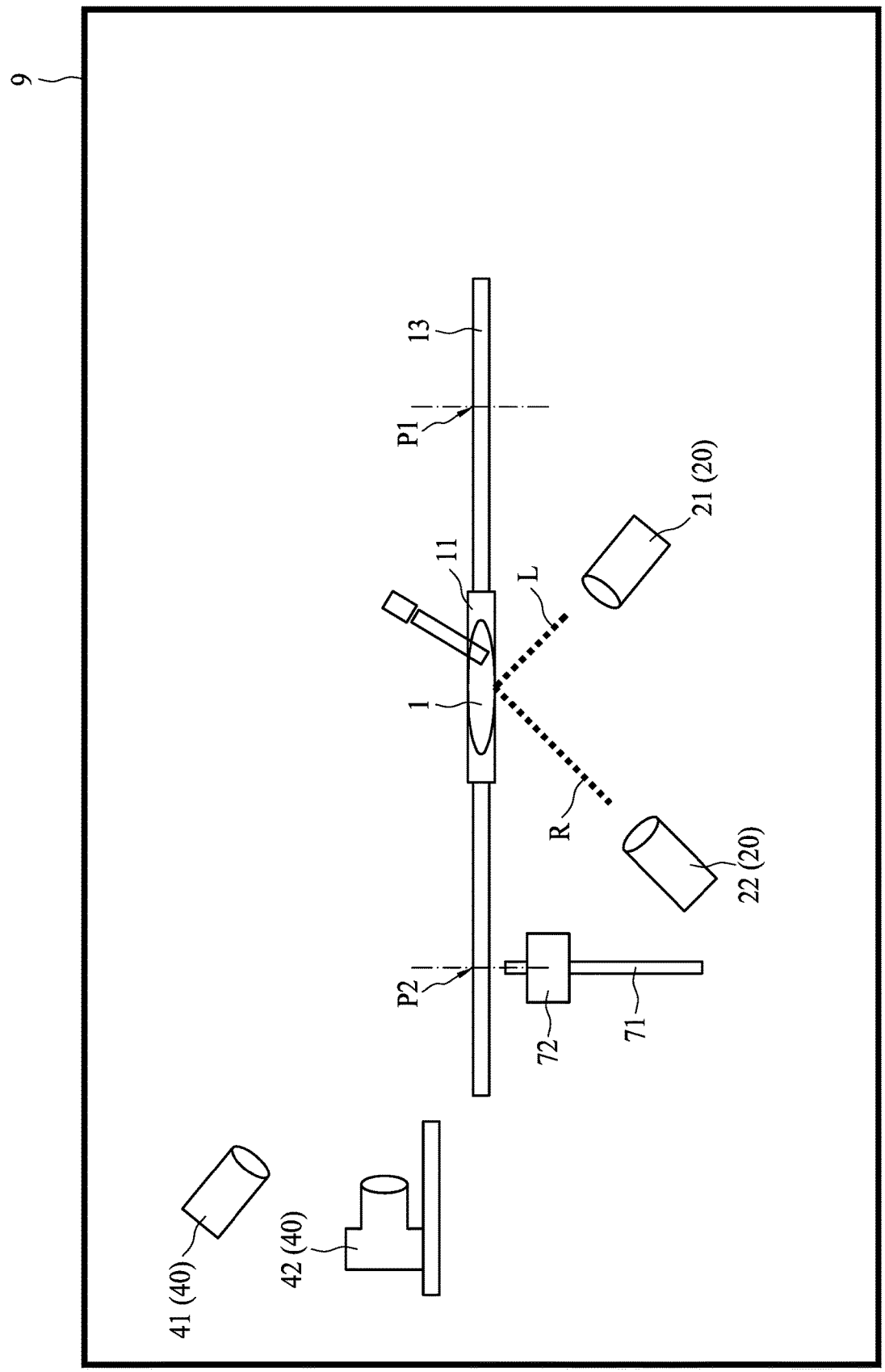
FIG. 8A is a schematic drawing illustrating an apparatus during substrate inspection at various stages in side view, in accordance with some embodiments of the present disclosure.
Figure 8B:
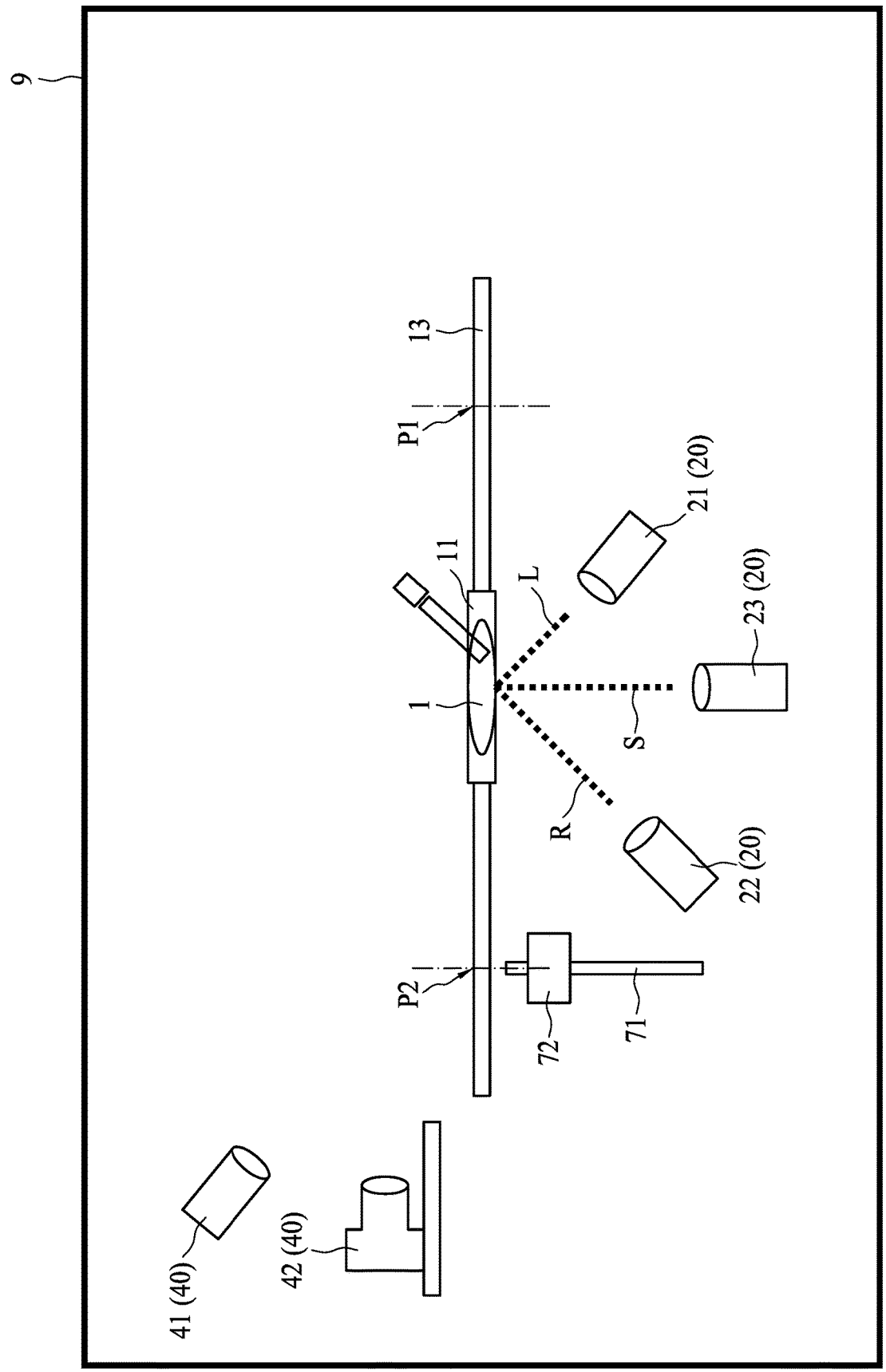
FIG. 8B is a schematic drawing illustrating an apparatus during substrate inspection at various stages in side view, in accordance with some embodiments of the present disclosure.
Figure 8C:
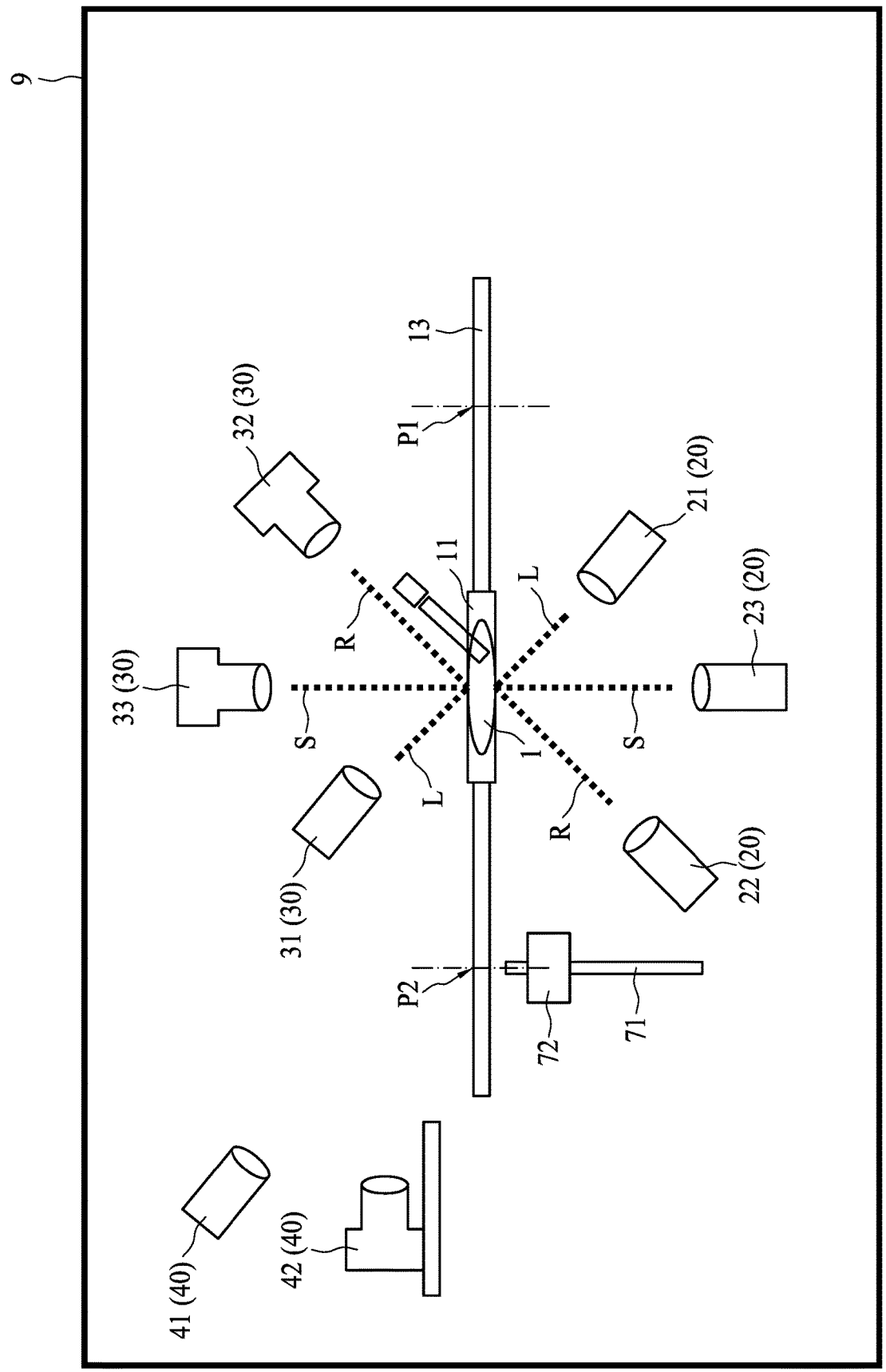
FIG. 8C is a schematic drawing illustrating an apparatus during substrate inspection at various stages in side view, in accordance with some embodiments of the present disclosure.

Referring to FIG. 1B and FIG. 8A to 8C, FIG. 8A to 8C are schematic drawings illustrating an apparatus during substrate inspection at various stages in side view, in accordance with some embodiments of the present disclosure. In operation 111, the substrate 1 is transferred from the second position P2 to the first position P1. The operation 111 may further include a sub-operation 113, wherein backside inspection on the backside of the substrate 1 is performed during the substrate 1 being transferred through the intermediate position Pi between the second position P2 and the first position P1. Backside inspection performed in FIG. 8A, FIG. 8B, and FIG. 8C are similar to the operations demonstrated in FIG. 4A, FIG. 4B, FIG. 4C, respectively, whereas herein the inspecting direction is opposite thereof, while substrate 1 is at the second orientation during being transferred from the second position P2 to the first position P1.

In some embodiments, a mapping of defects obtained in one of the FIG. 8A, FIG. 8B, or FIG. 8C and the mapping of defects obtained in one of the FIG. 4A, FIG. 4B or FIG. 4C are complementary since the covered portion of backside in sub-operation 103 is exposed in sub-operation 111, thence incorporating the mapping of defects obtained in one of the FIG. 8A, FIG. 8B, or FIG. 8C and the mapping of defects obtained in one of the FIG. 4A, FIG. 4B, or FIG. 4C may generate a complete backside mapping of defects. In other words, the complete backside mapping of defects can be obtained by incorporating one backside inspection performed prior to edge inspection, and one backside inspection performed subsequent to edge inspection, wherein both two backside inspection and edge inspection are performed in the chamber 9. In some embodiments, the operation 111 may further include a sub-operation 114, as shown in FIG. 8C and similar to FIG. 4C, wherein frontside inspection on the frontside of the substrate 1 is performed during the substrate 1 being transferred from the second position P2 to the first position P1. In some embodiments, the sub-operation 114 may be performed concurrently, prior to, or subsequent to sub-operation 113. Time duration of performing both frontside inspection and backside inspection may be significantly reduced. However, note that in some other embodiments, one of the sub-operation 113 and the sub-operation 114 may be selectively performed in operation 111.

Figure 9:
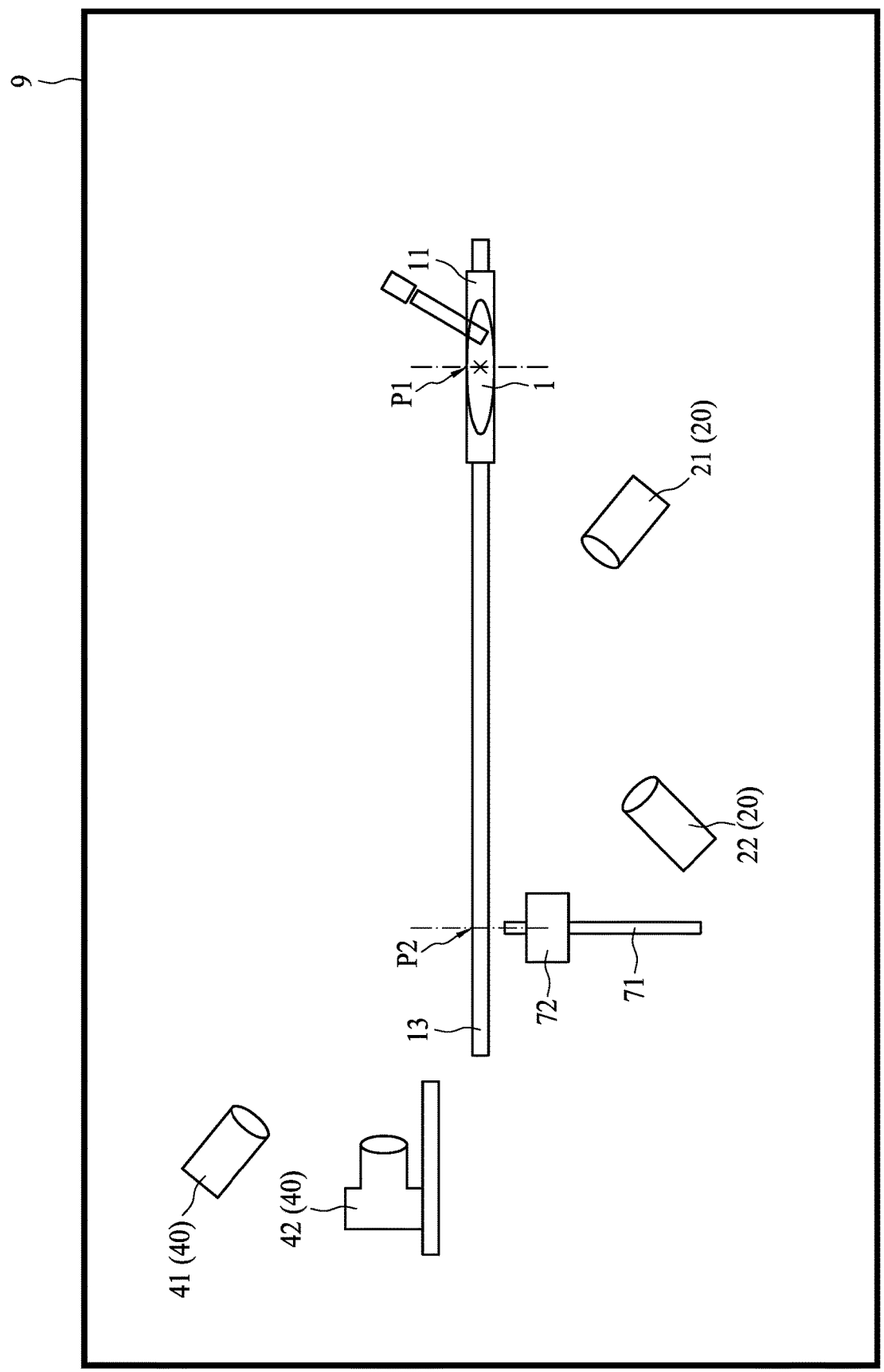
FIG. 9 is a schematic drawing illustrating an apparatus during substrate inspection at various stages in side view, in accordance with some embodiments of the present disclosure.

Referring to FIG. 1B and FIG. 9, FIG. 9 is a schematic drawing illustrating an apparatus during substrate inspection at various stages in side view, in accordance with some embodiments of the present disclosure. Subsequent to the operation 111, the substrate 1 is transferred to the first position P1, wherein the substrate 1 may be unloaded subsequently. In some embodiments, the substrate 1 is at the second orientation at the first position P1.

According to some of the embodiments in the present disclosure, FIG. 10 to FIG. 15 are schematic drawings illustrating an apparatus during substrate inspection at various stages.

Figure 10:
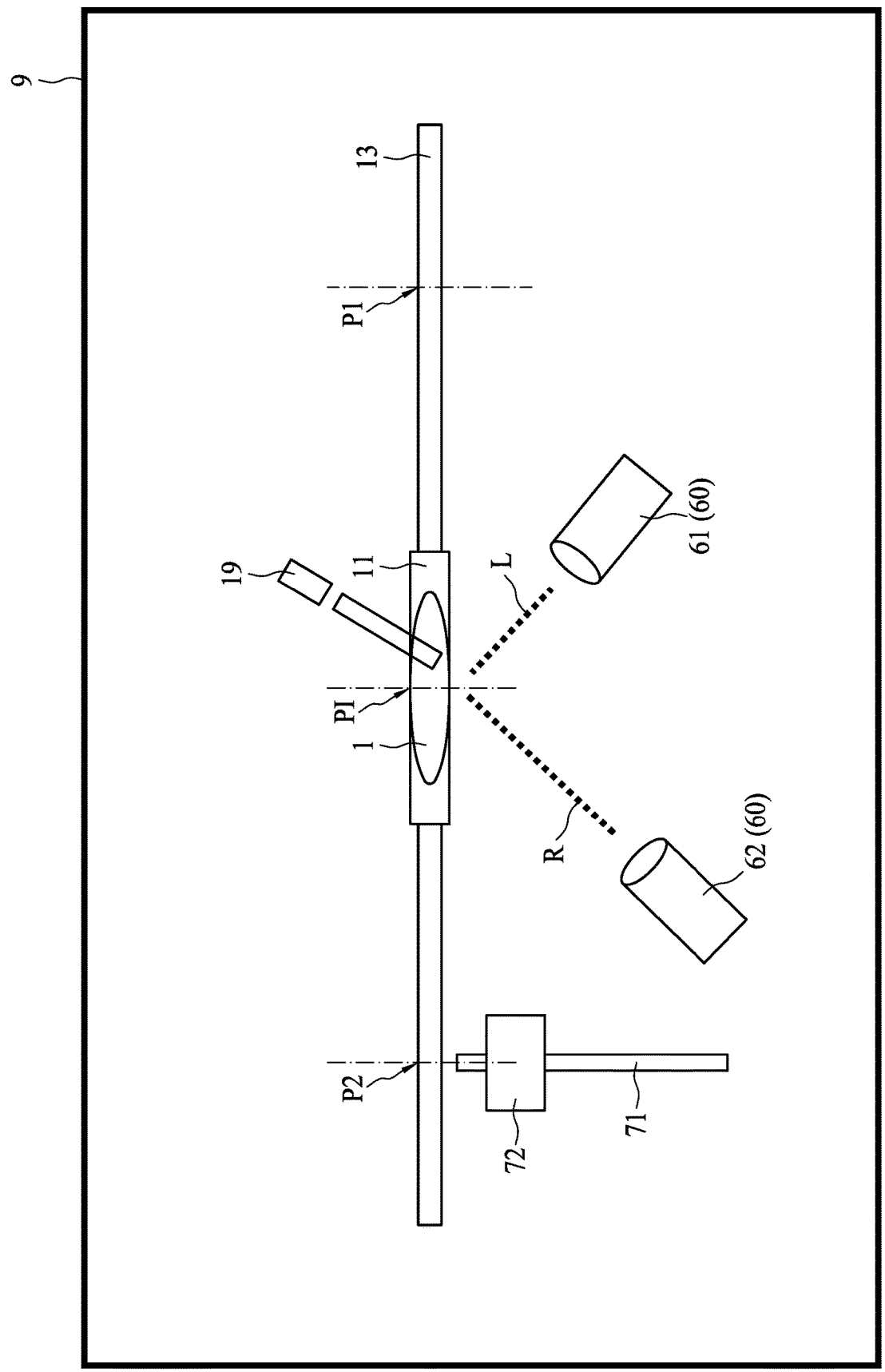
FIG. 10 to FIG. 15 are schematic drawings illustrating an apparatus during substrate inspection at various stages in side view, in accordance with some embodiments of the present disclosure.

Referring to FIG. 1B, FIG. 2, and FIG. 10, FIG. 10 is a schematic drawing illustrating an apparatus during substrate inspection at various stages in side view, in accordance with some embodiments of the present disclosure. In some embodiments, sub-operation 103 and sub-operation 113 may be performed by a movable inspector 60, wherein the movable inspector 60 is configured to transfer inside the chamber 9. Sub-operation 104 and/or sub-operation 114 may furtherly performed by the movable inspector 60. Note that hereinafter, elements in FIG. 10 to FIG. 15 being the same as or similar to aforesaid counterparts in FIG. 1A to FIG. 9 are denoted by the same reference numerals, as duplicated explanations are omitted. Subsequent to operation 101 wherein the substrate 1 is loaded at the first position P1, the substrate is transferred toward the second position P2 in operation 102. In some embodiments, the movable inspector 60 includes at least one movable light source 61 and at least one movable light receiver 62. The configuration and the principle of utilizing the movable inspector 60 including the movable light source 61 and the movable light receiver 62 herein is similar to the backside inspector 20 previously discussed in FIG. 4A to FIG. 4B. The movable inspector 60 may be easier to be adjusted based on predetermined inspection operations. The movable light source 61 emit a light L toward the backside of the substrate 1 when the substrate 1 transfers through the intermediate position Pi between the first position P1 and the second position P2, and the backside of the substrate 1 may reflect the light L while the movable light receiver 62 may receive the reflected light R thereof.

Thence the surface roughness of the backside of the substrate 1 may be obtained, further inferring the mapping of defects such as particles, residual films, slurry, peeling, cracks, containments, non-uniform surface, or damages induced on the backside of the substrate 1. The movable inspector 60 including at least one movable light source 61 and at least one movable light receiver 62 may, or may not be moved to a location beyond the first position P1 and the second position P2 to perform frontside inspection in the chamber 9 in sub-operation 104 during the substrate 1 being transferred from the first position P1 to the second position P2. In some other embodiments, frontside inspection may be performed by the frontside inspector 30 previously discussed in FIG. 4C.

Figure 11:
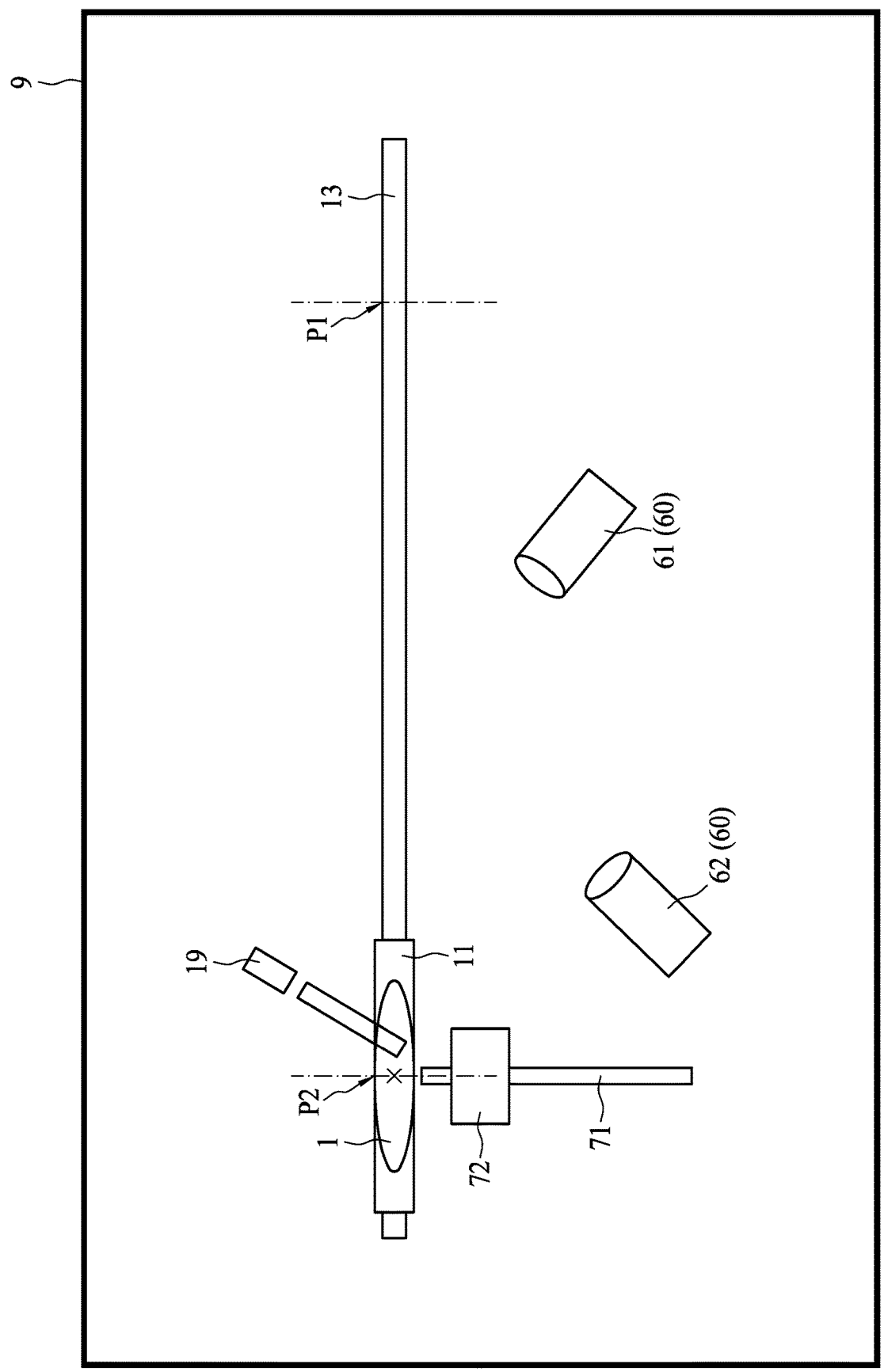

Referring to FIG. 1B and FIG. 11, FIG. 11 is a schematic drawing illustrating an apparatus during substrate inspection at various stages in side view, in accordance with some embodiments of the present disclosure. Subsequent to performing sub-operation 103 and/or sub-operation 104, the substrate 1 is transferred to the second position P2 in the operation 102. In operation 105, the lifter 71 under the second position P2 and in the chamber 9 is configured to receive the substrate 1 from the retractable arm 12 illustrated in FIG. 3A and FIG. 3B, the movable holder 11, or the securing arm 129 illustrated in FIG. 3D, further accommodating and transferring the substrate 1.

Figure 12:
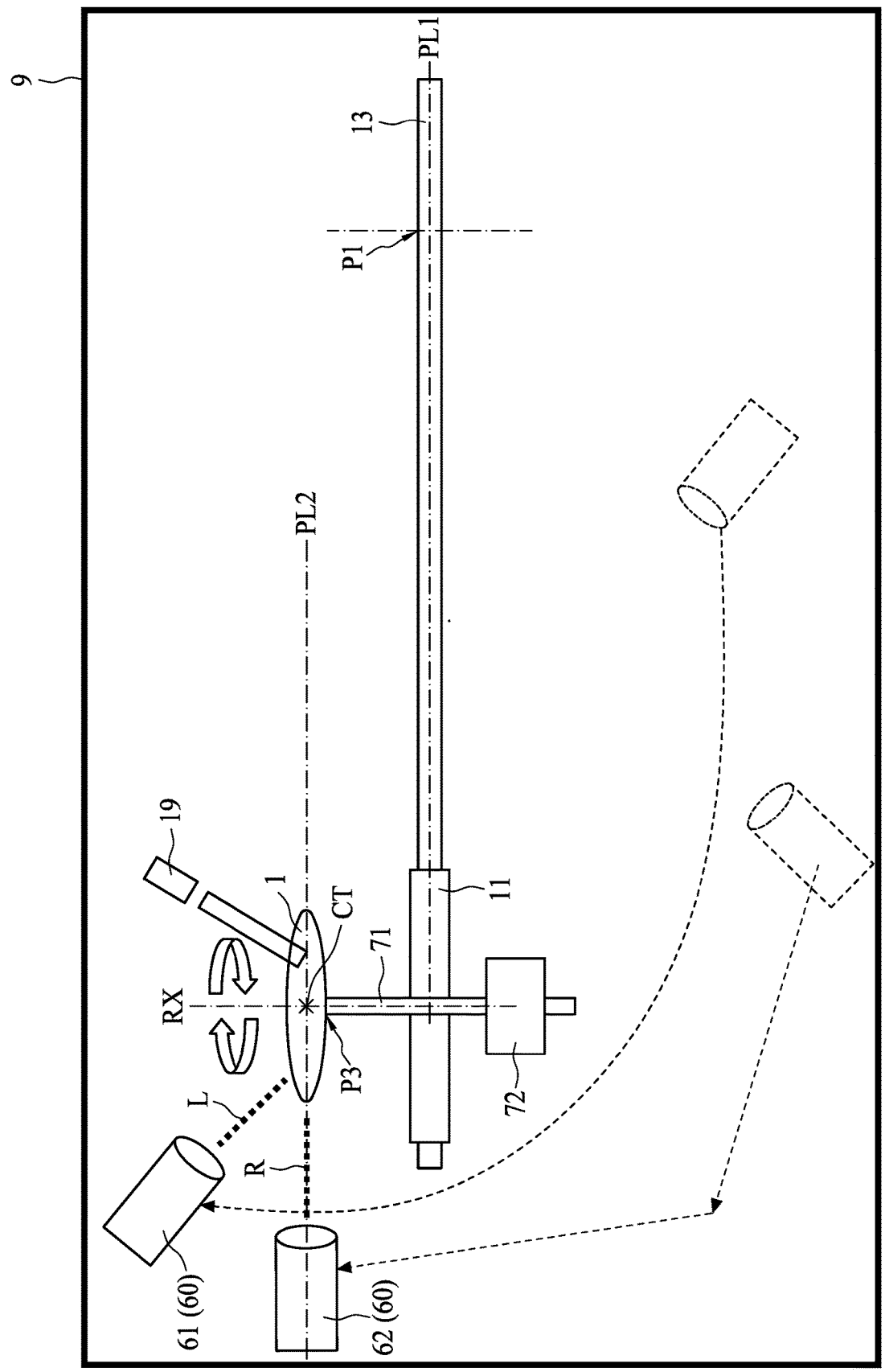

Referring to FIG. 1B and FIG. 12, FIG. 12 is a schematic drawing illustrating an apparatus during substrate inspection at various stages in side view, in accordance with some embodiments of the present disclosure. The substrate 1 is transferred from the second position P2 to the third position P3 by the lifter 71, and further supported by the lifter 71 at the third position P3. The edge area of the substrate 1 is thus exposed and edge inspection can be performed on the edge of the substrate 1 in operation 107. As previously discussed in FIG. 6A, the first position P1 and the second position P2 are on the first imaginary plane PL1, while the third position P3 is on the second imaginary plane PL2 different from the first imaginary plane PL1.

In some embodiments, the movable inspector 60 including at least one movable light source 61 and at least one movable light receiver 62 may be transferred to a location in the chamber 9 and near the third position to perform edge inspection in operation 107. The movable inspector 60 may be transferred subsequent to sub-operation 103 and/or sub-operation 104, and prior to operation 107. In some embodiments, the substrate 1 is rotated around a rotational axis RX passing through the center CT of the substrate 1 thus the movable inspector 60 may not be moved during edge inspection. In some other embodiments, the movable inspector 60 may be moved to inspect the edge area of the substrate 1. The movable inspector 60 may be moved linearly, obliquely, curvedly, crookedly, or the like.

Figure 13:
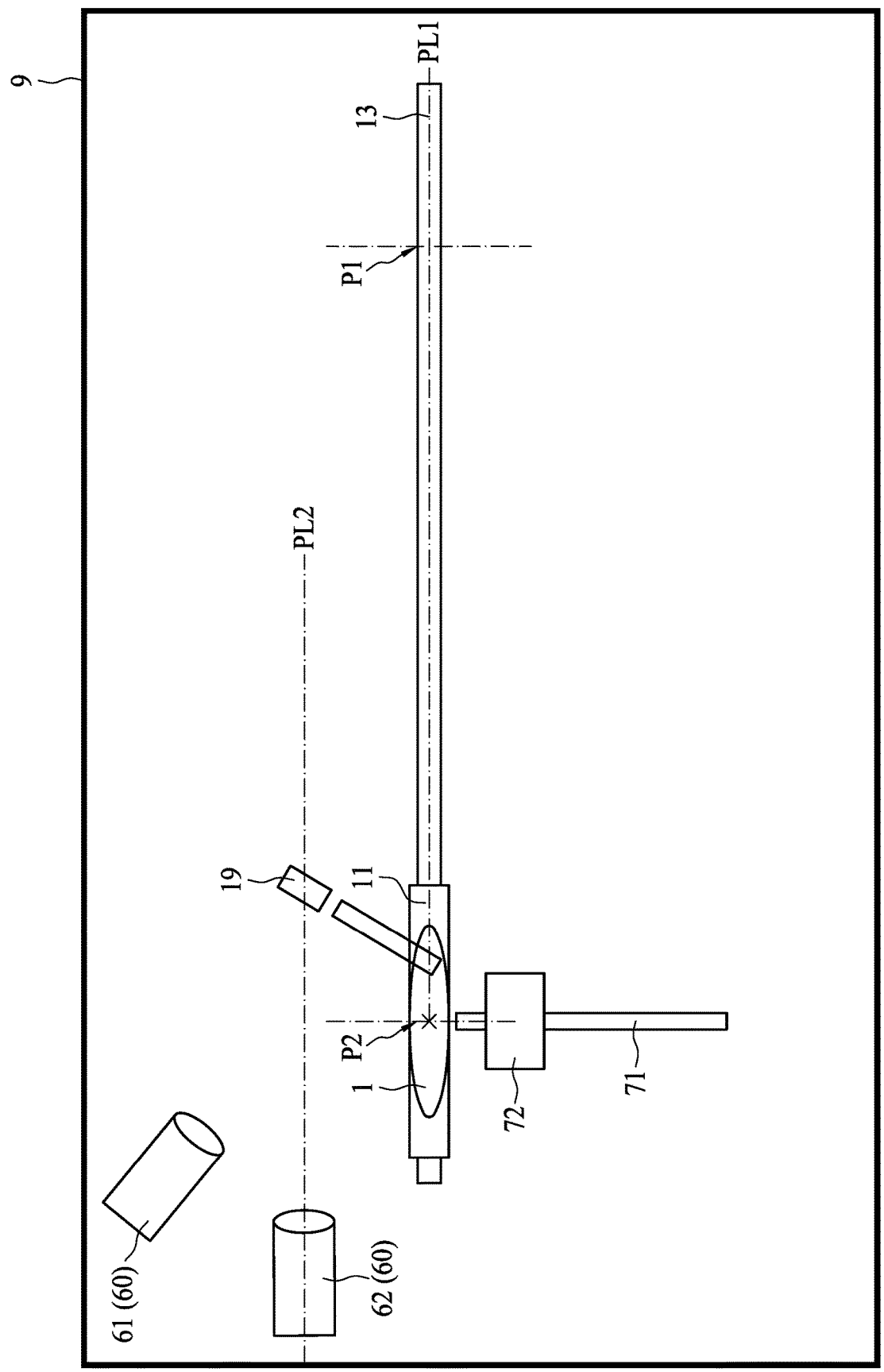

Referring to FIG. 1B and FIG. 13, FIG. 13 is a schematic drawing illustrating an apparatus during substrate inspection at various stages in side view, in accordance with some embodiments of the present disclosure. Subsequent to operation 107, the substrate 1 is transferred to the second position P2 by the lifter 71 in operation 109. In some embodiments, the substrate 1 is rotated from the first orientation to the second orientation by the lifter 71 prior to the operation 109, as previously discussed in FIG. 5B and FIG. 7B. The covered portion of the backside of the substrate 1 in sub-operation 103 can thus be exposed by the movable holder 11 and/or the retractable arm 12 in operation 103.

Figure 14:
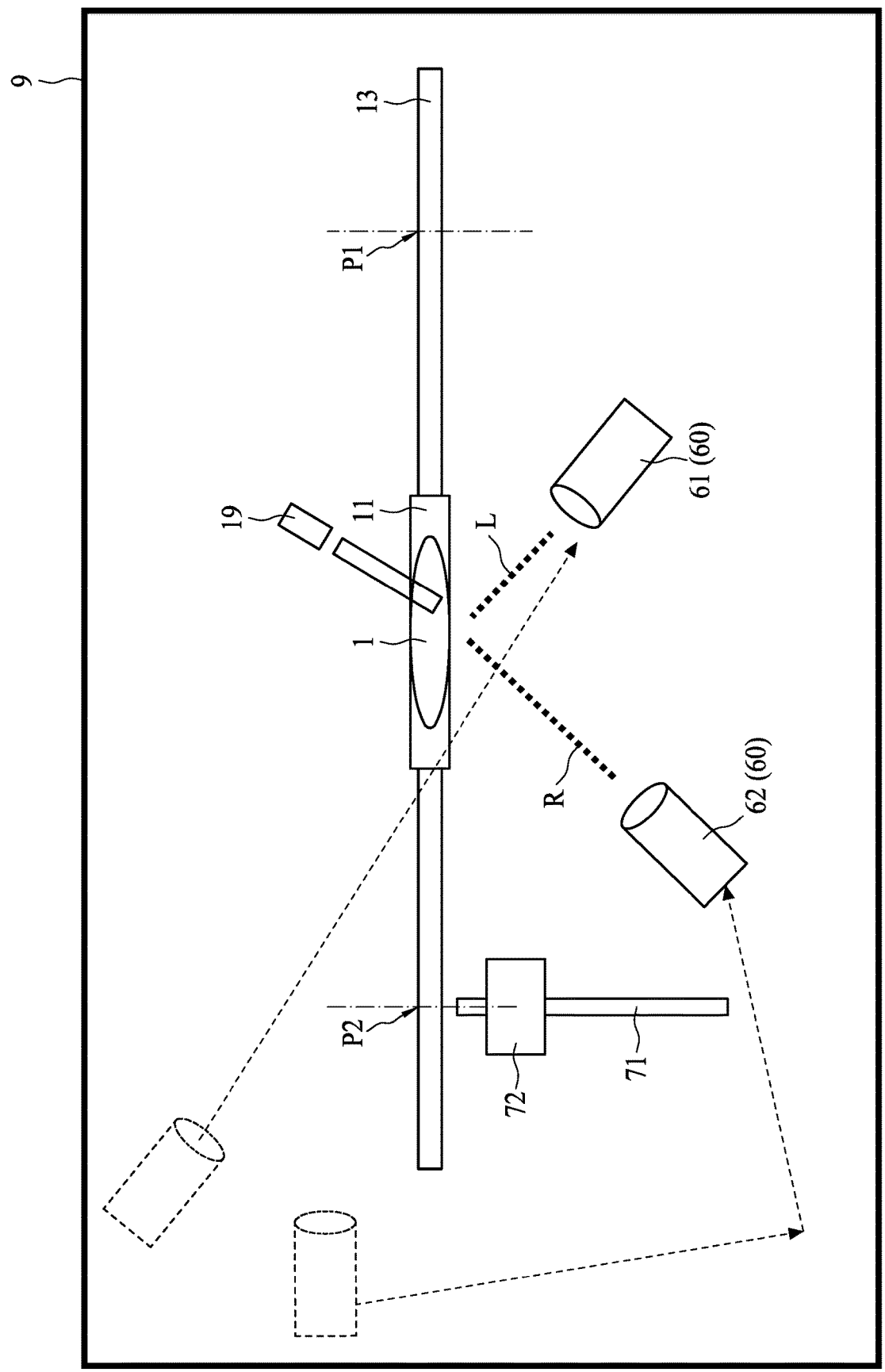

Referring to FIG. 1B and FIG. 14, FIG. 14 is a schematic drawing illustrating an apparatus during substrate inspection at various stages in side view, in accordance with some embodiments of the present disclosure. The movable inspector 60 including the movable light source 61 and the movable light receiver 62 can be moved to a position below the first position P1 and the second position P2 subsequent to operation 107, therefore backside inspection may be performed again when the substrate 1 transfers through the intermediate position Pi from the second position P2 to the first position P1 in operation 111. In some embodiments, a location of the movable light source 61 and the movable light receiver 62 herein may be identical to the location thereof in FIG. 10. The movable inspector 60 may be moved linearly, obliquely, curvedly, crookedly, or the like. In operation 111, the substrate 1 is transferred from the second position P2 to the first position P1. The operation 111 may further include a sub-operation 113, wherein backside inspection on the backside of the substrate 1 is performed during the substrate 1 being transferred through the intermediate position Pi between the second position P2 and the first position P1. The backside inspection performed in FIG. 14 is similar to the operations demonstrated in FIG. 4A or FIG. 4B, whereas herein the inspecting direction is opposite thereof, while substrate 1 is at the second orientation during being transferred from the second position P2 to the first position P1. In some embodiments, a mapping of defects obtained in one of the FIG. 14 and the mapping of defects obtained in one of the FIG. 10 are complementary since the covered portion of the backside in sub-operation 103 is exposed in sub-operation 111, thence incorporating the mapping of defects obtained in FIG. 14 and FIG. 10 may generate a complete backside mapping of defects.

In some embodiments, the operation 111 may further include a sub-operation 114, as shown in FIG. 8C and similar to FIG. 4C, wherein frontside inspection on the frontside of the substrate 1 is performed in the chamber 9 during the substrate 1 being transferred from the second position P2 to the first position P1. In some embodiments, the sub-operation 114 may be performed concurrently, prior to, or subsequent to sub-operation 113. Time duration of performing both frontside inspection and backside inspection may be significantly reduced. However, note that in some other embodiments, one of the sub-operation 113 and the sub-operation 114 may be selectively performed in operation 111. The movable inspector 60 including at least one movable light source 61 and at least one movable light receiver 62 may, or may not be moved to a location beyond the first position P1 and the second position P2 to perform frontside inspection in the sub-operation 114 during the substrate 1 being transferred from the second position P2 to the first position P1. In some other embodiments, frontside inspection may be performed by the frontside inspector 30 previously discussed in FIG. 4C.

Figure 15:
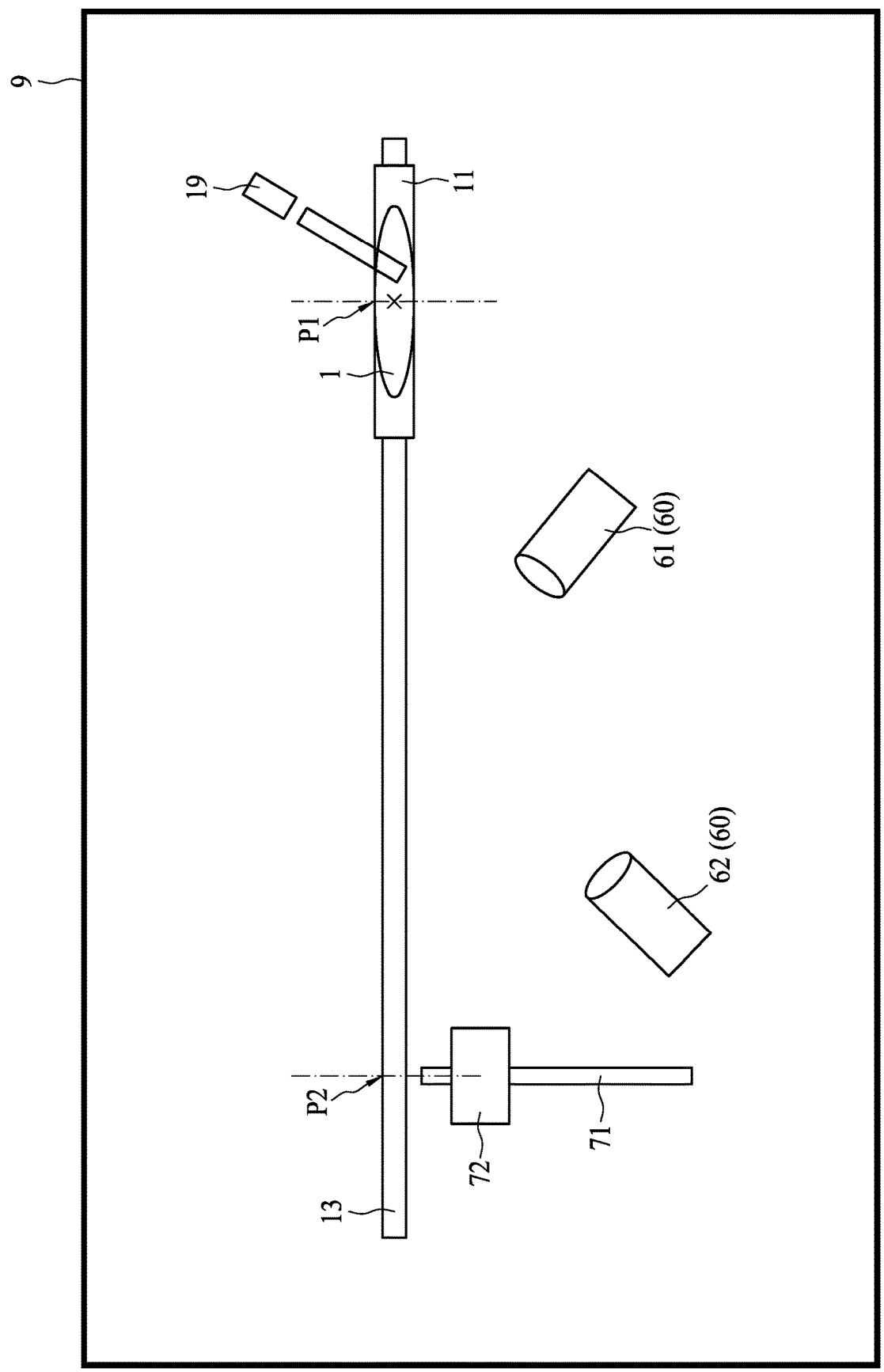

Referring to FIG. 1B and FIG. 15, FIG. 15 is a schematic drawing illustrating an apparatus during substrate inspection at various stages in side view, in accordance with some embodiments of the present disclosure. Subsequent to the operation 111, the substrate 1 is transferred to the first position P1, wherein the substrate 1 may be unloaded subsequently. In some embodiments, the substrate 1 is at the second orientation at the first position P1.

Some embodiments of the present disclosure provide an apparatus along with methods to incorporate edge area inspection with backside inspection and/or frontside inspection in the chamber 9, or in one module. By utilizing a configuration of the guiding linkage 13 and the lifter 71 to expose the backside and the edge area respectively during transferring the substrate 1, the efficiency of the inspection operation may be improved, as the duration of transferring the substrate 1 may be reduced. By altering an orientation of the substrate 1 subsequent to edge inspection may aid to avoid the interference from the edge-handling holder, thus help realizing the incorporation of edge area inspection with backside inspection and/or frontside inspection in the chamber 9.

In addition, by virtue of the configuration including a plurality of light receivers (or further including a plurality of light sources) may allow the apparatus to obtain a bright field defect mapping and a dark field defect mapping simultaneously, thus improving the accuracy and/or the efficiency of defect detection operation. And by using CCD of line camera, the complete mapping of the exposed substrate surface can be obtained within one scan while the substrate is transferred from the first position P1 to the second position P2, as a second scan is performed to complete the complete mapping of the substrate surface while the substrate is transferred from the second position P2 to the first position P1, if the surface thereof was interfered by the holder in the previous scanning. Furthermore, by immobilized inspectors may reduce cost and improve efficiency, while movable inspectors may provide easier adjustable inspection operations.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Some embodiments of the present disclosure provide an apparatus for substrate inspection, including a chamber, a movable holder in the chamber and configured to hold a substrate and transfer the substrate between a first position and a second position, a first inspector under the first position and the second position in the chamber, and configured to inspect a backside of the substrate, a lifter under the second position in the chamber, and configured to support the substrate and move the substrate from the second position to a third position, and a second inspector near the third position in the chamber and configured to inspect an edge of the substrate at the third position.

Some embodiments of the present disclosure provide an apparatus for substrate inspection, including a movable holder in a chamber and configured to transfer a substrate on a first plane, wherein a backside of the substrate is exposed by the movable holder, a retractable arm disposed in the chamber and on the movable holder for receiving the substrate, the retractable arm comprising a pair of arms, wherein a distance between the pair of arms is adjustable according to a size of the substrate, a first inspector in the chamber and configured to inspect the backside of the substrate, a lifter in the chamber and configured to move the substrate between the first plane and a second plane, and a second inspector in the chamber and configured to inspect an edge of the substrate on the second plane.

Some embodiments of the present disclosure provide a method for inspecting a substrate, including loading a substrate in a chamber, transferring the substrate from a first position to a second position, performing backside inspection on a backside of the substrate in the chamber during the substrate being transferred from the first position to the second position, transferring the substrate from the second position to a third position, and performing edge inspection on an edge of the substrate in the chamber during the substrate being rotated at the third position.

What is claimed is:

1. A method for inspecting a substrate, comprising:
    loading a substrate in a chamber;
    transferring the substrate from a first position to a second position different from the first position;
    performing backside inspection on a backside of the substrate in the chamber during a movement of the substrate being transferred from the first position to the second position;
    lifting the substrate from the second position to a third position above the second position by a lifter below the second position; and
    performing edge inspection on an edge of the substrate in the chamber during the substrate being rotated at the third position.

2. The method of claim 1, further comprising:
    transferring the substrate from the third position to the second position subsequent to performing edge inspection on the edge of the substrate, wherein the substrate is at a first orientation during the substrate being transferred from the first position to the second position, and the substrate is rotated to a second orientation different from the first orientation; and
    transferring the substrate from the second position to the first position when the substrate is at the second orientation.

3. The method of claim 2, further comprising performing backside inspection on the backside of the substrate again during the substrate being transferred from the second position to the first position.

4. The method of claim 1, wherein the performing backside inspection on the backside of the substrate comprises emitting light on the backside of the substrate by a light source fixed in the chamber, and receiving light by at least one light receiver fixed in the chamber.

5. The method of claim 1, wherein the performing edge inspection on the edge of the substrate comprises emitting light on the edge of the substrate by a light source fixed in the chamber, and receiving light by at least one light receiver fixed in the chamber.

6. The method of claim 1, further comprising performing frontside inspection on a frontside of the substrate.

7. The method of claim 1, wherein the backside inspection is performed prior to the lifter being underneath a coverage of a vertical projection area of the substrate.

8. A method for inspecting a substrate, comprising:
    loading a substrate in a chamber;

transferring the substrate from a first position to a second position different from the first position;
performing a first backside inspection on a backside of the substrate in the chamber;
lifting the substrate from the second position to a third position above the second position by a lifter below the second position;
performing edge inspection on an edge of the substrate in the chamber during the substrate being rotated at the third position;
transferring the substrate from the third position to the second position subsequent to performing edge inspection on the edge of the substrate, wherein the substrate is at a first orientation during the substrate being transferred from the first position to the second position, and the substrate is rotated to a second orientation different from the first orientation; and
transferring the substrate from the second position to the first position when the substrate is at the second orientation.

9. The method of claim 8, wherein the first backside inspection is performed during a movement of the substrate being transferred from the first position to the second position, wherein the first position and the second position are at a same level.

10. The method of claim 8, further comprising performing a second backside inspection during a movement of the substrate being transferred from the second position to the first position.

11. The method of claim 8, wherein the first backside inspection is performed when the lifter is free from being underneath a coverage of a vertical projection area of the substrate.

12. A method for inspecting a substrate, comprising:
loading a substrate in a chamber;
transferring the substrate from a first position to a second position different from the first position;
performing a first backside inspection on a backside of the substrate in the chamber during a movement of the substrate being transferred from the first position to the second position;
rotating the substrate from a first orientation to a second orientation different from the first orientation subsequent to the first backside inspection;
transferring the substrate from the second position to the first position when the substrate is at the second orientation; and
performing a second backside inspection on the backside of the substrate in the chamber during a movement of the substrate being transferred from the second position to the first position.

13. The method of claim 12, wherein transferring the substrate from the first position to the second position comprises:
supporting a first portion of the substrate by a pair of arms of a movable holder.

14. The method of claim 13, wherein the arms are in direct contact with a second portion of the substrate during the second backside inspection, the second portion is different from the first portion.

15. The method of claim 12, further comprising lifting the substrate prior to rotating the substrate.

16. The method of claim 15, further comprising performing an edge inspection during the substrate being lifted.

17. The method of claim 13, further comprising adjusting a distance between the arms prior to transferring the substrate from the first position to the second position.

18. The method of claim 12, wherein the first backside inspection is performed when the lifter is free from being underneath a coverage of a vertical projection area of the substrate.

19. The method of claim 12, further comprising performing a front side inspection on a front side of the substrate during the movement of the substrate being transferred from the first position to the second position.

20. The method of claim 12, further comprising performing a front side inspection on a front side of the substrate during the movement of the substrate being transferred from the second position to the first position.

* * * * *